US012507451B2

(12) United States Patent
Kim et al.

(10) Patent No.: US 12,507,451 B2
(45) Date of Patent: Dec. 23, 2025

(54) INTEGRATED CIRCUIT DEVICE

(71) Applicant: SAMSUNG ELECTRONICS CO., LTD., Suwon-si (KR)

(72) Inventors: Gyeom Kim, Suwon-si (KR); Dahye Kim, Suwon-si (KR); Jinbum Kim, Suwon-si (KR); Kyungbin Chun, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 435 days.

(21) Appl. No.: 18/088,890

(22) Filed: Dec. 27, 2022

(65) Prior Publication Data

US 2023/0420518 A1    Dec. 28, 2023

(30) Foreign Application Priority Data

Jun. 24, 2022    (KR) ........................ 10-2022-0077814

(51) Int. Cl.
    *H10D 62/13*      (2025.01)
    *H01L 21/02*      (2006.01)
    (Continued)

(52) U.S. Cl.
    CPC ..... *H10D 62/151* (2025.01); *H01L 21/02532* (2013.01); *H10D 30/014* (2025.01); *H10D 30/43* (2025.01); *H10D 30/6735* (2025.01); *H10D 30/6757* (2025.01); *H10D 62/121* (2025.01); *H10D 62/832* (2025.01); *H10D 64/017* (2025.01)

(58) Field of Classification Search
    CPC .... H10D 84/834; H10D 30/62; H10D 62/151; H10D 30/6735; H10D 30/502; H10D 30/6757; H10D 62/119; H10D 62/121; H10D 30/797; H10D 64/256
    See application file for complete search history.

(56) References Cited

U.S. PATENT DOCUMENTS

| 10,263,100 B1 | 4/2019 | Bi et al. |
| 10,923,598 B2 | 2/2021 | Wang et al. |

(Continued)

FOREIGN PATENT DOCUMENTS

| KR | 10-2020-0136133 | 12/2020 |
| KR | 10-2020-0142158 | 12/2020 |

(Continued)

*Primary Examiner* — Wasiul Haider
(74) *Attorney, Agent, or Firm* — Fish & Richardson P.C.

(57) ABSTRACT

An integrated circuit (IC) device includes a fin-type active region, a channel region on the fin-type active region, a gate line surrounding the channel region, an outer insulating spacer covering a sidewall of the gate line, a source/drain region on the fin-type active region, wherein the source/drain region includes a buffer layer including a portion in contact with the channel region and a portion in contact with the fin-type active region, the buffer layer including an edge buffer portion having a smaller thickness than other portions thereof at a position adjacent to the outer insulating spacer, a local buffer pattern including a wedge portion, the wedge portion filling a space defined by the edge buffer portion and the outer insulating spacer, and a main body layer in contact with each of the buffer layer and the local buffer pattern.

14 Claims, 38 Drawing Sheets

(51) Int. Cl.
    *H10D 30/01*     (2025.01)
    *H10D 30/43*     (2025.01)
    *H10D 30/67*     (2025.01)
    *H10D 62/10*     (2025.01)
    *H10D 62/832*     (2025.01)
    *H10D 64/01*     (2025.01)

(56) References Cited

U.S. PATENT DOCUMENTS

| | | |
|---|---|---|
| 11,183,562 B2 | 11/2021 | Yi et al. |
| 11,195,954 B2 | 12/2021 | Cho et al. |
| 11,211,457 B2 | 12/2021 | Choi et al. |
| 2020/0168723 A1 | 5/2020 | Hsu et al. |
| 2021/0126106 A1* | 4/2021 | Wang ................. H10D 30/6757 |
| 2022/0190168 A1 | 6/2022 | Kim et al. |

FOREIGN PATENT DOCUMENTS

| | | |
|---|---|---|
| KR | 10-2020-0142765 | 12/2020 |
| KR | 10-2022-0082482 A | 6/2022 |

\* cited by examiner

INTEGRATED CIRCUIT DEVICE

CROSS-REFERENCE TO RELATED APPLICATION

This application is based on and claims priority under 35 U.S.C. § 119 to Korean Patent Application No. 10-2022-0077814, filed on Jun. 24, 2022, in the Korean Intellectual Property Office, the disclosure of which is incorporated by reference herein in its entirety.

BACKGROUND

The inventive concept relates to an integrated circuit (IC) device, and more particularly, to an IC device including a fin field-effect transistor (FinFET).

As the downscaling of IC devices has rapidly evolved, it has become necessary to ensure not only a high operating speed but also high operating accuracy in IC devices. At the same time, as the integration density of IC devices has increased and the sizes of IC devices have been reduced, the likelihood of process failures has increased during the manufacture of nanosheet FETs. Accordingly, it has become necessary to develop IC devices having new structures capable of eliminating the likelihood of process failures and improving the performance and reliability of field-effect transistors (FETs) having fin-type active regions.

SUMMARY OF THE INVENTION

The inventive concept provides an integrated circuit (IC) device in which a nanosheet field-effect transistor (FET) may provide stable performance and improved reliability.

According to an aspect of the inventive concept, there is provided an IC device including a fin-type active region extending along in a first lateral direction on a substrate, a channel region on the fin-type active region, a gate line surrounding the channel region on the fin-type active region, the gate line extending along a second lateral direction, the second lateral direction intersecting with the first lateral direction, an outer insulating spacer covering a sidewall of the gate line, a source/drain region adjacent to the gate line on the fin-type active region, the source/drain region being in contact with the channel region and the outer insulating spacer, wherein the source/drain region includes a buffer layer including a portion in contact with the channel region and a portion in contact with the fin-type active region, the buffer layer including an edge buffer portion having a smaller thickness than other portions thereof at a position adjacent to the outer insulating spacer, a local buffer pattern including a wedge portion, the wedge portion filling a space defined by the edge buffer portion of the buffer layer and the outer insulating spacer, and a main body layer in contact with each of the buffer layer and the local buffer pattern.

According to an aspect of the inventive concept, there is provided an IC device including a fin-type active region extending along a first lateral direction on a substrate, a plurality of nanosheets facing a fin top surface of the fin-type active region at a position apart from the fin top surface of the fin-type active region, the plurality of nanosheets being at vertical distances from the fin top surface of the fin-type active region, a gate line surrounding each of the plurality of nanosheets on the fin-type active region, the gate line extending along a second lateral direction, wherein the second lateral direction intersects with the first lateral direction, an outer insulating spacer covering a sidewall of the gate line, and a source/drain region facing the plurality of nanosheets in the first lateral direction, wherein the source/drain region includes a buffer layer including portions respectively in contact with the plurality of nanosheets and a portion in contact with the fin-type active region, the buffer layer including a plurality of edge buffer portions having a smaller thickness than other portions thereof at a position adjacent to the outer insulating spacer, a plurality of local buffer patterns filling a plurality of spaces defined by the plurality of edge buffer portions and the outer insulating spacer, the plurality of local buffer patterns being separate from each other, and a main body layer in contact with each of the buffer layer and the plurality of local buffer patterns.

According to another aspect of the inventive concept, there is provided an IC device including a fin-type active region extending long in a first lateral direction on a substrate, a pair of nanosheet stacks facing a fin top surface of the fin-type active region in a vertical direction at a position separate from the fin top surface of the fin-type active region, each nanosheet stack including a plurality of nanosheets being at different vertical distances from the fin top surface of the fin-type active region, a pair of gate lines on the pair of nanosheet stacks on the fin-type active region, the pair of gate lines extending along a second lateral direction, wherein the second lateral direction intersects with the first lateral direction, a pair of outer insulating spacers respectively covering sidewalls of the pair of gate lines, and a source/drain region on the fin-type active region between the pair of nanosheet stacks, the source/drain region including a $Si_{1-x}Ge_x$ layer (here, $x \neq 0$) doped with boron (B), wherein the source/drain region includes a buffer layer in contact with a plurality of nanosheets in each of the pair of nanosheet stacks, the buffer layer including an edge buffer portion having a smaller thickness than other portions thereof at a position adjacent to the plurality of outer insulating spacers, the edge buffer portion defining at least one wedge-type space along with an outer insulating spacer adjacent thereto from among the plurality of outer insulating spacers, at least one local buffer pattern filling the at least one wedge-type space, and a main body layer in contact with each of the buffer layer and the at least one local buffer pattern.

BRIEF DESCRIPTION OF THE DRAWINGS

Embodiments of the inventive concept will be more clearly understood from the following detailed description taken in conjunction with the accompanying drawings in which:

FIGS. 7 to 19B are cross-sectional views of a process sequence of a method of manufacturing an IC device, according to exemplary embodiments, wherein FIGS. 7, 8, 9, 10A, 11A, 12A, 13A, 14A, 15A, 16A, 17A, 18A, and 19A are cross-sectional views of exemplary sectional structures of a portion corresponding to the cross-section taken along line X1-X1' of FIG. 1, according to a process sequence, FIGS. 10B, 11B, 12B, 13B, 14B, 15B, 16B, 17B, 18B, and 19B are cross-sectional views of exemplary sectional structures of a portion corresponding to the cross-section taken along line X2-X2' of FIG. 1, according to a process sequence.

DETAILED DESCRIPTION OF THE PREFERRED EMBODIMENTS

Figure 1:
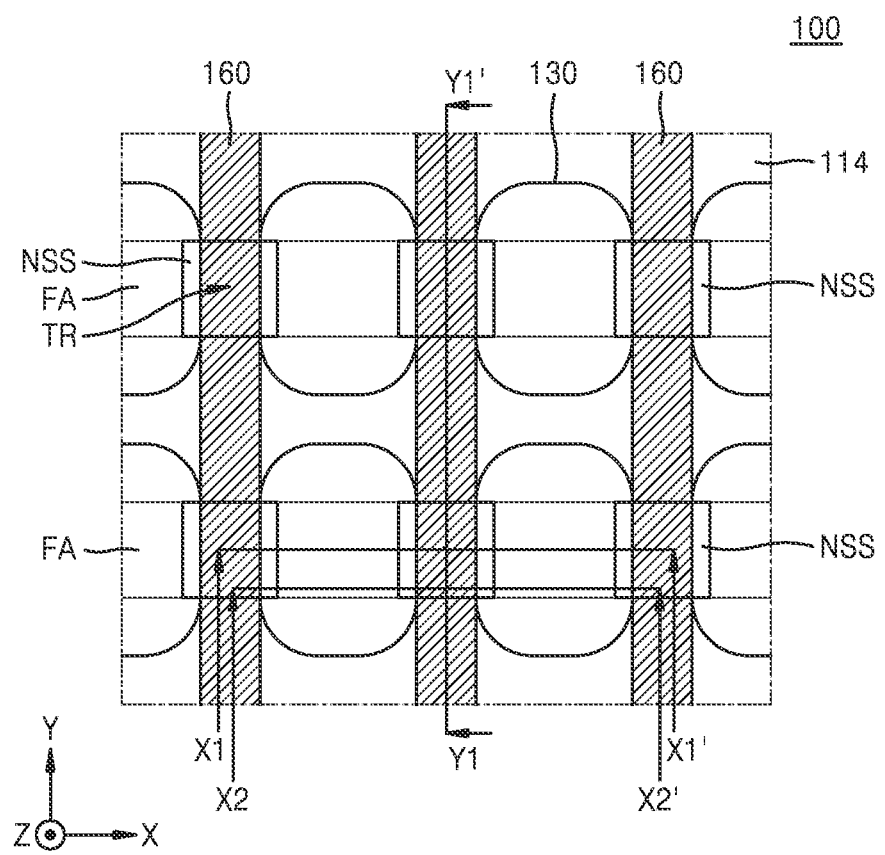
FIG. 1 is a plan layout diagram of some components of an integrated circuit (IC) device according to exemplary embodiments.

Hereinafter, embodiments will be described in detail with reference to the accompanying drawings. The same reference numerals are used to denote the same elements in the drawings, and repeated descriptions thereof are omitted as redundant.

Figure 2A:
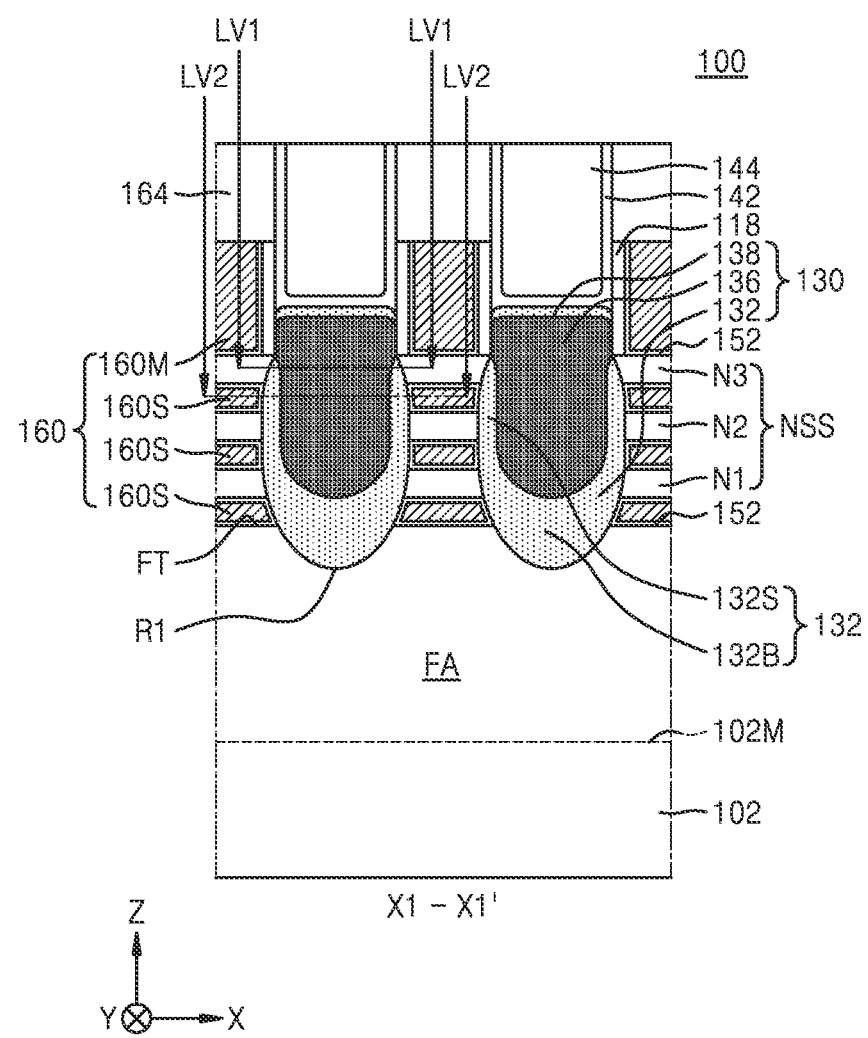
FIG. 2A is a cross-sectional view taken along line X1-X1' of FIG. 1.
Figure 2B:
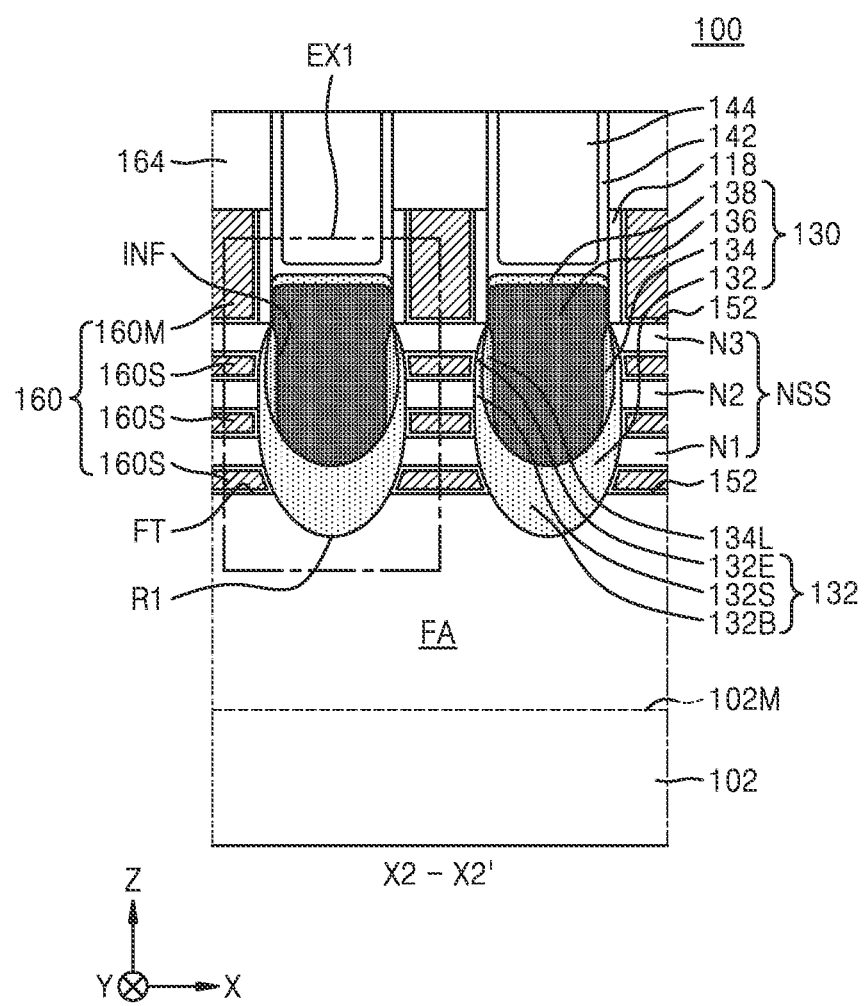
FIG. 2B is a cross-sectional view taken along line X2-X2' of FIG. 1.
Figure 2C:
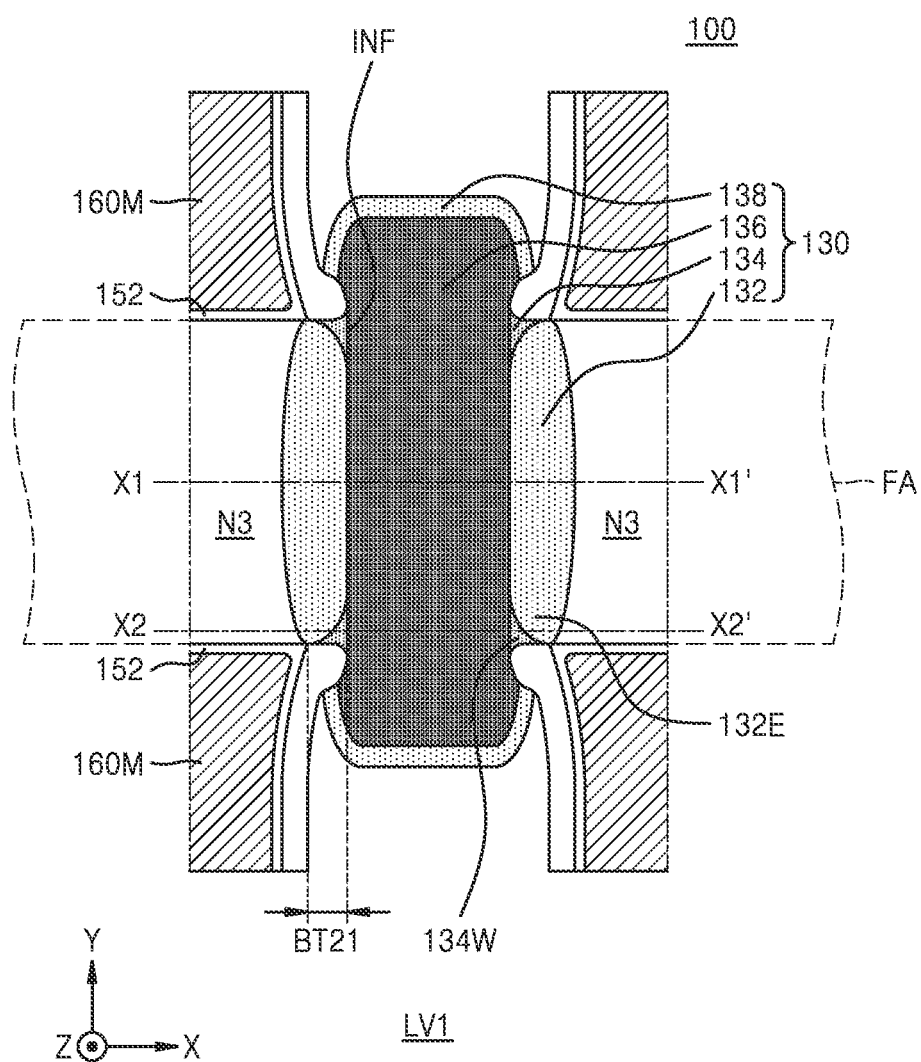
FIG. 2C is an enlarged plan view of some components at a vertical level LV1 according to a cross-section taken along line LV1-LV1 of FIG. 2A.
Figure 2D:
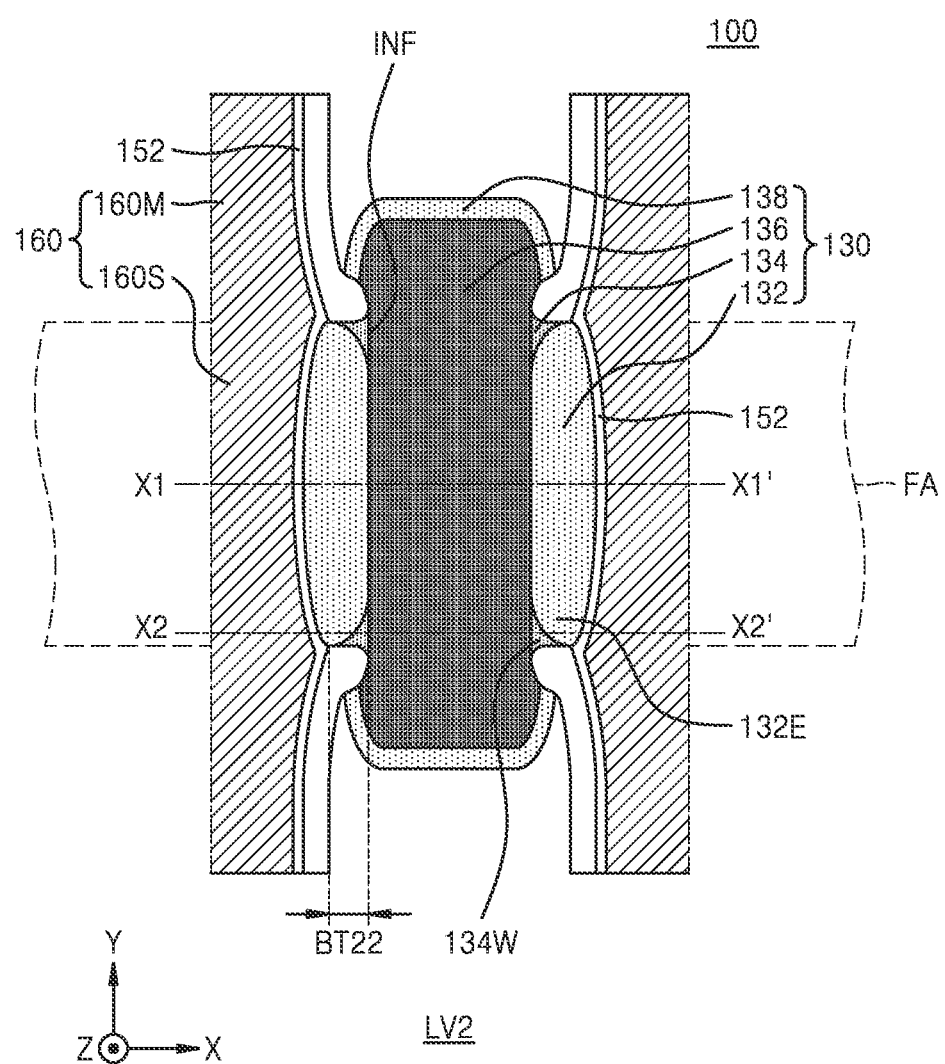
FIG. 2D is an enlarged plan view of some components at a vertical level LV2 according to a cross-section taken along line LV2-LV2 of FIG. 2A.
Figure 2E:
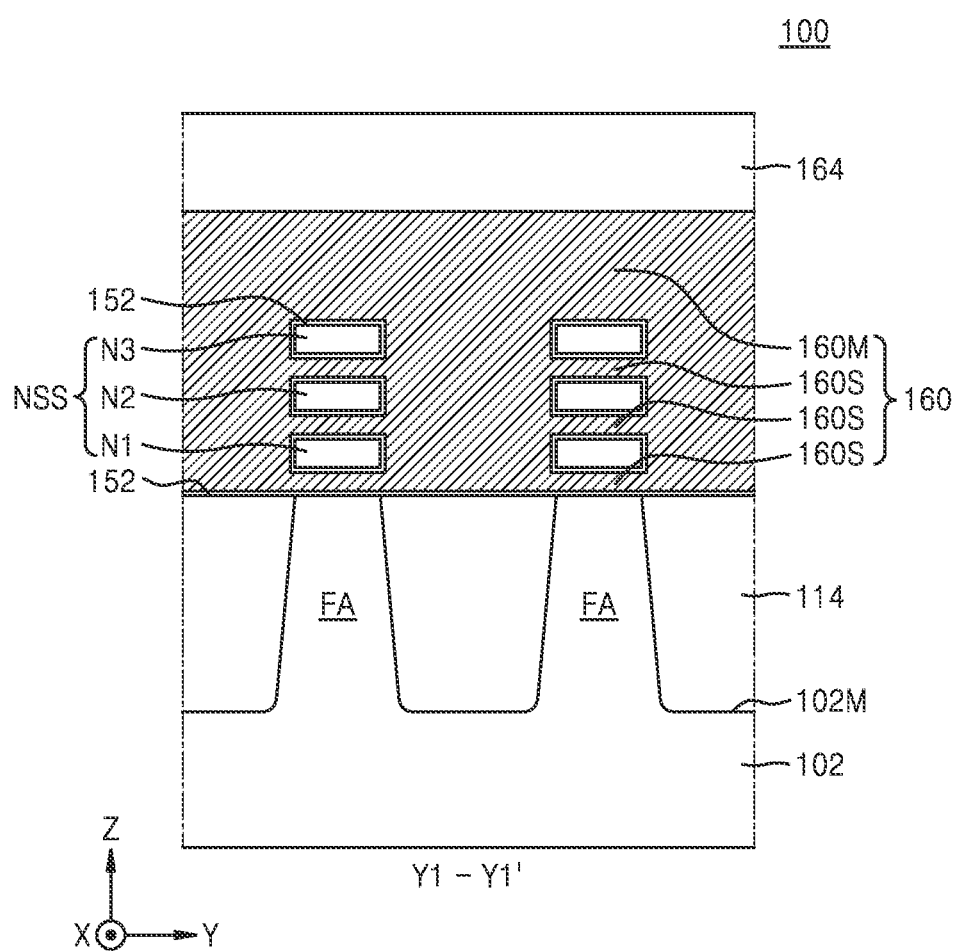
FIG. 2E is a cross-sectional view taken along line Y1-Y1' of FIG. 1.
Figure 2F:
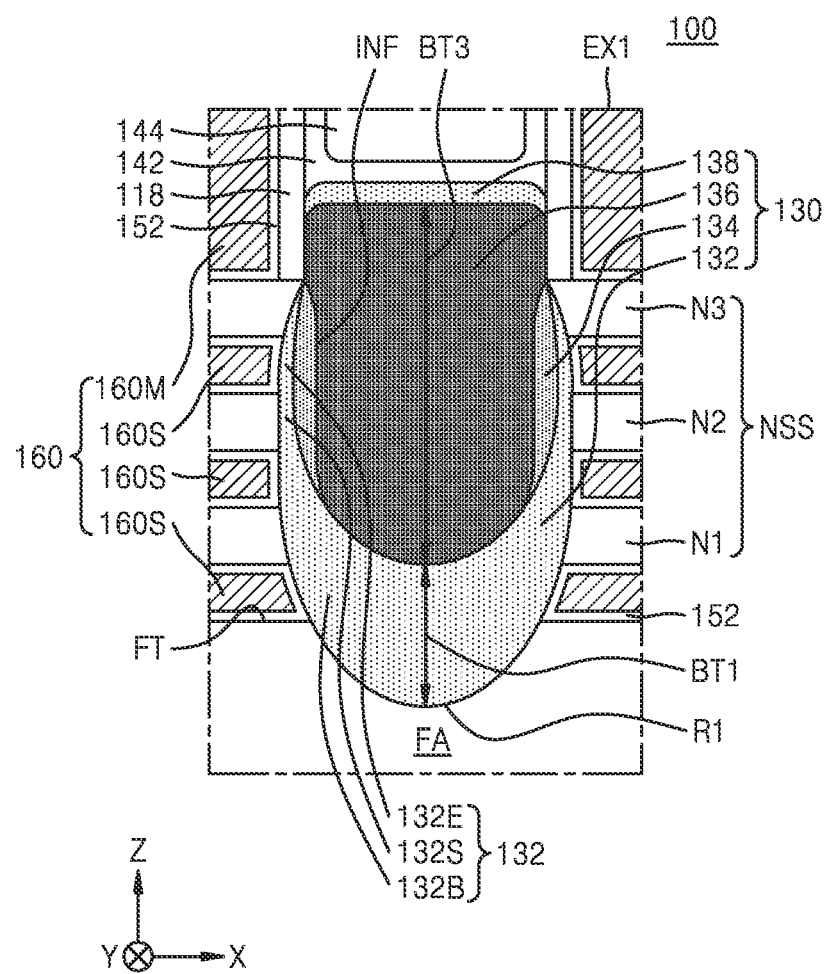
FIG. 2F is an enlarged cross-sectional view of a local region "EX1" of FIG. 2B.

FIG. 1 is a plan layout diagram of some components of an integrated circuit (IC) device 100 according to exemplary embodiments. FIG. 2A is a cross-sectional view taken along line X1-X1' of FIG. 1. FIG. 2B is a cross-sectional view taken along line X2-X2' of FIG. 1. FIG. 2C is an enlarged plan view of some components at a vertical level LV1 according to a cross-section taken along line LV1-LV1 of FIG. 2A. FIG. 2D is an enlarged plan view of some components at a vertical level LV2 according to a cross-section taken along line LV2-LV2 of FIG. 2A. FIG. 2E is a cross-sectional view taken along line Y1-Y1' of FIG. 1. FIG. 2F is an enlarged cross-sectional view of a local region "EX1" of FIG. 2B. The IC device 100 including a field-effect transistor (FET) TR having a gate-all-around structure including an active region of a nanowire or nanosheet type and a gate surrounding the active region will now be described with reference to FIGS. 1 and 2A to 2F.

Referring to FIGS. 1 and 2A to 2F, the IC device 100 may include a plurality of fin-type active regions FA and a plurality of nanosheet stacks NSS. The plurality of fin-type active regions FA may protrude upward from a substrate 102 in a vertical direction (Z direction) and extend long in a first lateral direction (X direction). The plurality of nanosheet stacks NSS may be on the plurality of fin-type active regions FA. As used herein, the term "nanosheet" refers to a conductive structure having a cross-section that is substantially perpendicular to a direction in which current flows. The nanosheet may be interpreted as including a nanowire.

The substrate 102 may include a semiconductors, such as silicon (Si) or germanium (Ge), or a compound semiconductor, such as silicon germanium (SiGe), silicon carbide (SiC), gallium arsenide (GaAs), indium arsenide (InAs), indium gallium arsenide (InGaAs), or indium phosphide (InP). As used herein, each of the terms "SiGe," "SiC," "GaAs," "InAs," "InGaAs," and "InP" refers to a material including elements included therein, without referring to a chemical formula representing a stoichiometric relationship.

A device isolation film (see 114 in FIG. 1) covering both sidewalls of each of the plurality of fin-type active regions FA may be disposed on the substrate 102. The device isolation film 114 may include an oxide film, a nitride film, or a combination thereof.

A plurality of gate lines 160 may be disposed on the plurality of fin-type active regions FA. Each of the plurality of gate lines 160 may extend in a second lateral direction (Y direction), which intersects with the first lateral direction (X direction).

The plurality of nanosheet stacks NSS may be respectively disposed on fin top surfaces FT of the plurality of fin-type active regions FA in regions where the plurality of fin-type active regions FA intersect with the plurality of gate lines 160. Each of the plurality of nanosheet stacks NSS may include at least one nanosheet, which is apart from the fin top surface FT of the fin-type active region FA in the vertical direction (Z direction) and faces the fin top surface FT of the fin-type active region FA.

As shown in FIGS. 2A and 2B, each of the plurality of nanosheet stacks NSS may include a first nanosheet N1, a second nanosheet N2, and a third nanosheet N3, which overlap each other in the vertical direction (Z direction) on the fin-type active region FA. The first nanosheet N1, the second nanosheet N2, and the third nanosheet N3 may be at different vertical distances (Z-directional distances) from the fin top surface FT of the fin-type active region FA.

FIG. 1 illustrates a case in which the nanosheet stack NSS has approximately a rectangular planar shape, without being limited thereto. The nanosheet stack NSS may have various planar shapes according to a planar shape of each of the fin-type active region FA and the gate line 160. The present exemplary embodiment pertains to a configuration in which the plurality of nanosheet stacks NSS and the plurality of gate lines 160 are formed on one fin-type active region FA, and the plurality of nanosheet stacks NSS are arranged in a line in the first lateral direction (X direction) on one fin-type active region FA. However, according to other exemplary embodiments, the numbers of nanosheet stacks NSS and gate lines 160 on one fin-type active region FA are not specifically limited.

Each of the first to third nanosheets N1, N2, and N3 in the nanosheet stack NSS may have a channel region. As used herein, each of the first to third nanosheets N1, N2, and N3 may be referred to as the channel region. In some exemplary embodiments, each of the first to third nanosheets N1, N2, and N3 may have a thickness selected in a range of about 4 nm to about 6 nm, without being limited thereto. Here, the thickness of each of the first to third nanosheets N1, N2, and N3 refers to a size of each of the first to third nanosheets N1, N2, and N3 in the vertical direction (Z direction). In further exemplary embodiments, the first to third nanosheets N1, N2, and N3 may have substantially the same thickness in the vertical direction (Z direction). In still other exemplary embodiments, at least some of the first to third nanosheets N1, N2, and N3 may have different thicknesses in the vertical direction (Z direction).

In exemplary embodiments, at least some of the first to third nanosheets N1, N2, and N3 included in one nanosheet stack NSS may have different sizes in the first lateral direction (X direction). In other exemplary embodiments, at least some of the first to third nanosheets N1, N2, and N3 may have the same size in the first lateral direction (X direction).

As shown in FIGS. 2A to 2F, each of the plurality of gate lines 160 may include a main gate portion 160M and a plurality of sub-gate portions 160S. The main gate portion 160M may cover a top surface of the nanosheet stack NSS and extend in the second lateral direction (Y direction). The plurality of sub-gate portions 160S may be integrally connected to the main gate portion 160M and be respectively arranged between the first to third nanosheets N1, N2, and N3 and between the first nanosheet N1 and the fin-type active region FA. In the vertical direction (Z direction), a thickness of each of the plurality of sub-gate portions 160S may be less than a thickness of the main gate portion 160M.

Each of the gate lines 160 may include a metal, a metal nitride, a metal carbide, or a combination thereof. The metal may be selected from titanium (Ti), tungsten (W), ruthenium (Ru), niobium (Nb), molybdenum (Mo), hafnium (Hf), nickel (Ni), cobalt (Co), platinum (Pt), ytterbium (Yb), terbium (Tb), dysprosium (Dy), erbium (Er), and palladium (Pd). The metal nitride may be selected from titanium nitride (TiN) and tantalum nitride (TaN). The metal carbide may include titanium aluminum carbide (TiAlC). However, a material included in the plurality of gate lines 160 is not limited to the examples described above.

A gate dielectric film 152 may be disposed between the nanosheet stack NSS and the gate line 160. In exemplary embodiments, the gate dielectric film 152 may have a stack structure of an interface dielectric film and a high-k dielectric film. The interface dielectric film may include a low-k dielectric material film (e.g., a silicon oxide film, a silicon oxynitride film, or a combination thereof), which has a dielectric constant of about 9 or less. In other exemplary embodiments, the interface dielectric film may be omitted altogether. The high-k dielectric film may include a material having a higher dielectric constant than a silicon oxide film. For example, the high-k dielectric film may have a dielectric constant of about 10 to 25. The high-k dielectric film may include hafnium oxide, without being limited thereto.

As shown in FIG. 2A, a pair of source/drain regions 130 may be on both sides of the gate line 160 with one gate line 160 therebetween on the fin-type active region FA. One source/drain region 130 may be on the fin-type active region FA between a pair of nanosheet stacks NSS, which are adjacent to each other. The source/drain region 130 may be in contact with a sidewall of the nanosheet stack NSS, which is surrounded by the gate line 160 adjacent thereto.

Both sidewalls of each of the plurality of gate lines 160 may be covered by outer insulating spacers 118. The outer insulating spacers 118 may cover both sidewalls of the main gate portion 160M on the top surface of each of the plurality of nanosheet stacks NSS. The outer insulating spacer 118 may be separate from the gate line 160 with a gate dielectric film 152 therebetween. The outer insulating spacer 118 may include silicon nitride, silicon oxide, silicon carbonitride (SiCN), silicon boron nitride (SiBN), silicon oxynitride (SiON), silicon oxycarbonitride (SiOCN), silicon boron carbonitride (SiBCN), silicon oxycarbide (SiOC), or a combination thereof. As used herein, each of the terms "SiCN," "SiBN," "SiON," "SiOCN," "SiBCN," and "SiOC" refers to a material including elements included therein, without referring to a chemical formula representing a stoichiometric relationship.

As shown in FIGS. 2A, 2B, and 2F, each of the plurality of source/drain regions 130 may include a portion thereof, which overlaps the outer insulating spacer 118 in the vertical direction (Z direction). For example, a portion of each of the plurality of source/drain regions 130, which overlaps the outer insulating spacer 118 in the vertical direction (Z direction), may have a width selected in a range from about 0 nm to about 4 nm in the first lateral direction (X direction). In other exemplary embodiments, each of the plurality of source/drain regions 130 may not include a portion that overlaps the main gate portion 160M in the vertical direction (Z direction).

Both sidewalls of each of the plurality of sub-gate portions 160S may be separate from the source/drain region 130 with the gate dielectric film 152 therebetween. The gate dielectric film 152 may include a portion in contact with a buffer layer 132 of the source/drain region 130.

As shown in FIGS. 2A and 2B, a plurality of recesses R1 may be formed in the fin-type active region FA. A lowermost surface of each of the plurality of recesses R1 may be at a lower vertical level than the fin top surface FT of the fin-type active region FA. As used herein, the term "vertical level" refers to a height from a main surface 102M of the substrate 102 in a vertical direction (Z direction or −Z direction).

As shown in FIGS. 2A and 2B, a plurality of source/drain regions 130 may be respectively inside the plurality of recesses R1. Each of the plurality of source/drain regions 130 may be adjacent to at least one gate line 160 selected from the plurality of gate lines 160. Each of the plurality of source/drain regions 130 may have sidewalls facing the first to third nanosheets N1, N2, and N3 included in the nanosheet stack NSS adjacent thereto. Each of the plurality of source/drain regions 130 may be in contact with the first to third nanosheets N1, N2, and N3 included in the nanosheet stack NSS adjacent thereto.

As shown in FIGS. 2A to 2D and 2F, each of the plurality of source/drain regions 130 may include the buffer layer 132, a plurality of local buffer patterns 134 each covering a local region of the buffer layer 132, a main body layer 136 in contact with the buffer layer 132 and each of the plurality of local buffer patterns 134, and a capping layer 138.

In each of the plurality of source/drain regions 130, the buffer layer 132 may include a portion in contact with the first to third nanosheets N1, N2, and N3 and a portion in contact with the fin-type active region FA. The buffer layer 132 may include an edge buffer portion 132E that is adjacent to the outer insulating spacer 118. The edge buffer portion 132E may have a smaller thickness than other portions of the buffer layer 132.

In exemplary embodiments, each of the plurality of local buffer patterns 134 in the source/drain region 130 may include a wedge portion 134W and a liner portion 134L. Each of the plurality of source/drain regions 130 may include four local buffer patterns 134, which are separate from each other. Each of the four local buffer patterns 134 may include a portion in contact with the outer insulating spacer 118.

As shown in FIGS. 2C and 2D, the wedge portion 134W of each of the plurality of local buffer patterns 134 may fill a wedge-type space (e.g., a wedge-type space WS shown in FIG. defined by the edge buffer portion 132E of the buffer layer 132 and the outer insulating spacer 118. The liner portion 134L may be integrally connected to the wedge portion 134W. As shown in FIGS. 2A, 2B, and 2F, in the source/drain region 130, the liner portion 134L of the local buffer pattern 134 may be between the buffer layer 132 and the main body layer 136.

As shown in FIGS. 2C and 2D, in a cross-section parallel to the main surface 102M of the substrate 102 (i.e., a cross-section along an X-Y plane), a width of the wedge portion 134W of the local buffer pattern 134 in the second lateral direction (Y direction) may gradually increase in a direction away from the third nanosheet N3, which is farthest from the substrate 102 from among a plurality of nanosheets included in the nanosheet stack NSS.

As shown in FIGS. 2C and 2D, in the cross-section parallel to the main surface 102M of the substrate 102 (i.e., the cross-section along an X-Y plane), an interface between the wedge portion 134W of the local buffer pattern 134 and the main body layer 136 in the source/drain region 130 may be on an extension line of an interface between the buffer layer 132 and the main body layer 136. The interface between the wedge portion 134W of the local buffer pattern 134 and the main body layer 136 and the interface between the buffer layer 132 and the main body layer 136 may form a planar surface that extends in a plane without bends. To facilitate the understanding of relative positions and shapes of components of the IC device 100, FIGS. 2C and 2D each illustrate a planar shape of the fin-type active region FA with a dashed line in FIGS. 2C and 2D and a partial position of the cross-section taken along line X1-X1' of FIG. 2A and a partial position of the cross-section taken along line X2-X2' of FIG. 2B.

In the source/drain region 130, the main body layer 136 may be in contact with the buffer layer 132 and each of the plurality of local buffer patterns 134. The main body layer 136 may have a top surface that is at a higher vertical level than an uppermost surface of each of the plurality of nanosheet stacks NSS. The capping layer 138 may cover a surface of the main body layer 136.

As shown in FIGS. 2A and 2B, the buffer layer 132 may include a bottom buffer portion 132B in contact with the fin-type active region FA and a side buffer portion 132S in contact with each of the first to third nanosheets N1, N2, and N3. In the buffer layer 132, a thickness (see BT1 in FIG. 2F) of the bottom buffer portion 132B in the vertical direction (Z direction) may be greater than a thickness (see BT21 of FIG. 2C or BT22 of FIG. 2D) of the side buffer portion 132S in the first lateral direction (X direction).

A thickness of the side buffer portion 132S of the buffer layer 132 in the first lateral direction (X direction) may vary depending on a distance from the outer insulating spacer 118. As shown in FIGS. 2A and 2B, a thickness of the side buffer portion 132S of the buffer layer 132 in the first lateral direction (X direction) may be reduced in a direction toward the outer insulating spacer 118. A thickness of the side buffer portion 132S in the first lateral direction (X direction) in a cross-section including an edge portion of the fin-type active region FA, which is taken in the second lateral direction (Y direction) as shown in FIG. 2B, may be less than a thickness of the side buffer portion 132S in the first lateral direction (X direction) in a cross-section including a central portion of the fin-type active region FA, which is taken in the second lateral direction (Y direction) as shown in FIG. 2A.

As shown in FIGS. 2C and 2D, in the source/drain region 130, each of the plurality of local buffer patterns 134 may overlap the fin-type active region FA in the vertical direction (Z direction) at a position that is nearer to the edge portion of the fin-type active region FA than the central portion thereof in the second lateral direction (Y direction). In other exemplary embodiments, the local buffer pattern 134 of the source/drain region 130 may vertically overlap the fin-type active region FA at a position that is adjacent to an edge portion of the nanosheet stack NSS in the second lateral direction (Y direction).

In the source/drain region 130, each of the buffer layer 132, the local buffer pattern 134, and the main body layer 136 may include a $Si_{1-x}Ge_x$ layer (here, x≠0) doped with a p-type dopant. Each of the buffer layer 132, the local buffer pattern 134, and the main body layer 136 may include a $Si_{1-x}Ge_x$ layer (here, x≠0) doped with a p-type dopant, and each of a Ge content of the buffer layer 132 and a Ge content of the local buffer pattern 134 may be lower than a Ge content of the main body layer 136.

In exemplary embodiments, the buffer layer 132, the local buffer pattern 134, and the main body layer 136 may have different Ge contents from each other, each of the Ge content of the buffer layer 132 and the Ge content of the local buffer pattern 134 may be lower than the Ge content of the main body layer 136, and the Ge content of the local buffer pattern 134 may be higher than the Ge content of the buffer layer 132.

In other exemplary embodiments, the buffer layer 132, the local buffer pattern 134, and the main body layer 136 may have different Ge contents from each other, each of the Ge contents of the buffer layer 132 and the Ge content of the local buffer pattern 134 may be lower than the Ge content of the main body layer 136, and the Ge content of the local buffer pattern 134 may be lower than the Ge content of the buffer layer 132.

In still other exemplary embodiments, each of the Ge content of the buffer layer 132 and the Ge content of the local buffer pattern 134 may be lower than the Ge content of the main body layer 136, and the Ge content of the buffer layer 132 may be equal to the Ge content of the local buffer pattern 134.

In exemplary embodiments, each of the buffer layer 132, the local buffer pattern 134, and the main body layer 136 may include a $Si_{1-x}Ge_x$ layer (here, x≠0) doped with a p-type dopant, and the concentration of the p-type dopant in an interfacial portion INF between the local buffer pattern 134 and the main body layer 136 may be higher than the concentration of the p-type dopant in other portions of the source/drain region 130. The p-type dopant in the source/drain region 130 may include boron (B), gallium (Ga), carbon (C), or a combination thereof, without being limited thereto.

For example, each of the buffer layers 132, the local buffer pattern 134, and the main body layer 136 may include a $Si_{1-x}Ge_x$ layer (here, x≠0) doped with boron (B). In the source/drain region 130, a Ge content may be higher in the main body layer 136 than in the buffer layer 132 and the local buffer pattern 134, and the concentration of boron in the interfacial portion INF between the local buffer pattern 134 and the main body layer 136 may be higher than the concentration of boron in the other portions of the source/drain region 130.

The capping layer 138 may include an un-doped Si layer, a Si layer doped with the p-type dopant, or a SiGe layer having a lower Ge content than the main body layer 136. In some exemplary embodiments, the capping layer 138 may not include germanium (Ge). For example, the capping layer 138 may include an un-doped Si layer. In other exemplary embodiments, the capping layer 138 may include a Si layer doped with boron or a SiGe layer doped with boron. In still other exemplary embodiments, the capping layer 138 may be omitted.

In exemplary embodiments, the buffer layer 132 may include a $Si_{1-x}Ge_x$ layer (here, 0.01≤x≤0.15) doped with boron, and the concentration of boron in the buffer layer 132 may be about 1E16 atoms/cm$^3$ or higher and about 1E20 atoms/cm$^3$ or lower. In other exemplary embodiments, the local buffer pattern 134 may include a $Si_{1-x}Ge_x$ layer (here, 0.0<x<0.20) doped with boron, and the concentration of boron in the local buffer pattern 134 may be about 1E16 atoms/cm$^3$ or higher and about 1E20 atoms/cm$^3$ or lower. In still other exemplary embodiments, the main body layer 136 may include a $Si_{1-x}Ge_x$ layer (here, 0.20≤x≤0.70) doped with boron, and the concentration of boron in the main body layer 136 may be about 1E19 atoms/cm$^3$ or higher and about 2E22 atoms/cm$^3$ or lower. In other exemplary embodiments, the concentration of the p-type dopant in the interfacial portion INF between the local buffer pattern 134 and the main body layer 136 may be about 5E20 atoms/cm$^3$ or more to about 7E22 atoms/cm$^3$ or less. However, the inventive concept is not limited to the examples described above.

In exemplary embodiments, a thickness (see BT1 in FIG. 2F) of the buffer layer 132 in the vertical direction (Z direction) along a vertical line that extends in the vertical direction (Z direction) from a lower portion of the source/drain region 130, which is in contact with the fin-type active region FA, may be about 1 nm to about 10 nm, and a thickness (see BT3 in FIG. 2F) of the main body layer 136 along the vertical line may be about 10 nm to about 100 nm, without being limited thereto.

In other exemplary embodiments, a thickness of the side buffer portion 132S of the buffer layer 132 in the first lateral direction (X direction) may be selected in a range of about 1 nm to about 10 nm, a range of about 1 nm to about 5 nm, a range of about 1 nm to about 3 nm, or a range of about 1 nm to about 2 nm. In exemplary embodiments, a thickness of the local buffer pattern 134 in the first lateral direction (X direction) may be selected in a range of about 1 nm to about 10 nm, a range of about 1 nm to about 5 nm, a range of about 1 nm to about 3 nm, or a range of about 1 nm to about 2 nm.

As shown in FIG. 1, on the substrate 102, a plurality of FETs TR may be formed at portions where the plurality of fin-type active regions FA intersect with the plurality of gate lines 160. The plurality of FETs TR may constitute a logic circuit or a memory device.

As shown in FIGS. 2A, 2B, and 2E, a top surface of each of the gate dielectric film 152, the gate line 160, and the outer insulating spacer 118 may be covered by a capping insulating pattern 164. The capping insulating pattern 164 may include a silicon nitride film.

As shown in FIGS. 2A and 2B, a plurality of outer insulating spacers 118 and the plurality of source/drain regions 130 may be covered by an insulating liner 142. The insulating liner 142 may include silicon nitride (SiN), silicon oxide (SiO), SiCN, SiBN, SiON, SiOCN, SiBCN, SiOC, or a combination thereof. In exemplary embodiments, the insulating liner 142 may be omitted. An inter-gate dielectric film 144 may be on the insulating liner 142. The inter-gate dielectric film 144 may include silicon nitride film, silicon oxide film, SiON, SiOCN, or a combination thereof. When the insulating liner 142 is omitted, the inter-gate dielectric film 144 may be in contact with the plurality of source/drain regions 130.

In the IC device 100 described with reference to FIGS. 1 and 2A to 2F, each of the plurality of source/drain regions 130 may include the buffer layer 132, the local buffer pattern 134, and the main body layer 136. The buffer layer 132 may include the edge buffer portion 132E having a smaller thickness than other portions thereof. The local buffer pattern 134 may include the wedge portion 134W filling the wedge-type space (see WS in FIG. 10C) that is defined by the edge buffer portion 132E of the buffer layer 132 and the outer insulating spacer 118. The main body layer 136 may be in contact with each of the buffer layer 132 and the local buffer pattern 134. The local buffer pattern 134 including the wedge portion 134W may partially cover the edge buffer portion 132E, which has a relatively small thickness in the buffer layer 132 of the source/drain region 130, at a position adjacent to the outer insulating spacer 118 covering the sidewall of the gate line 160, Thus, the source/drain region 130 may be prevented from being undesirably damaged from the exterior through the edge buffer portion 132, which is relatively vulnerable, of the buffer layer 132 of the source/drain region 130. Accordingly, during the process of forming the buffer layer 132 of the source/drain region 130, even when the edge buffer portion 132E having a relatively small thickness is formed adjacent to the outer insulating spacer 118 due to a facet growth mode that occurs in a portion adjacent to the outer insulating spacer 118, the function of the buffer layer 132 may be supplemented and/or reinforced by the local buffer pattern 134. As a result, of the buffer layer 132 of the source/drain region 130, a portion that may be vulnerable to an attack from the exterior may be selectively reinforced by the local buffer pattern 134. Therefore, during the manufacture of the IC device 100, failures, such as the deterioration of the source/drain region 130 by external attacks or the occurrence of a short circuit between the source/drain region 130 and a conductive region adjacent thereto, may be prevented, and the reliability of the IC device 100 may be improved.

Figure 3:
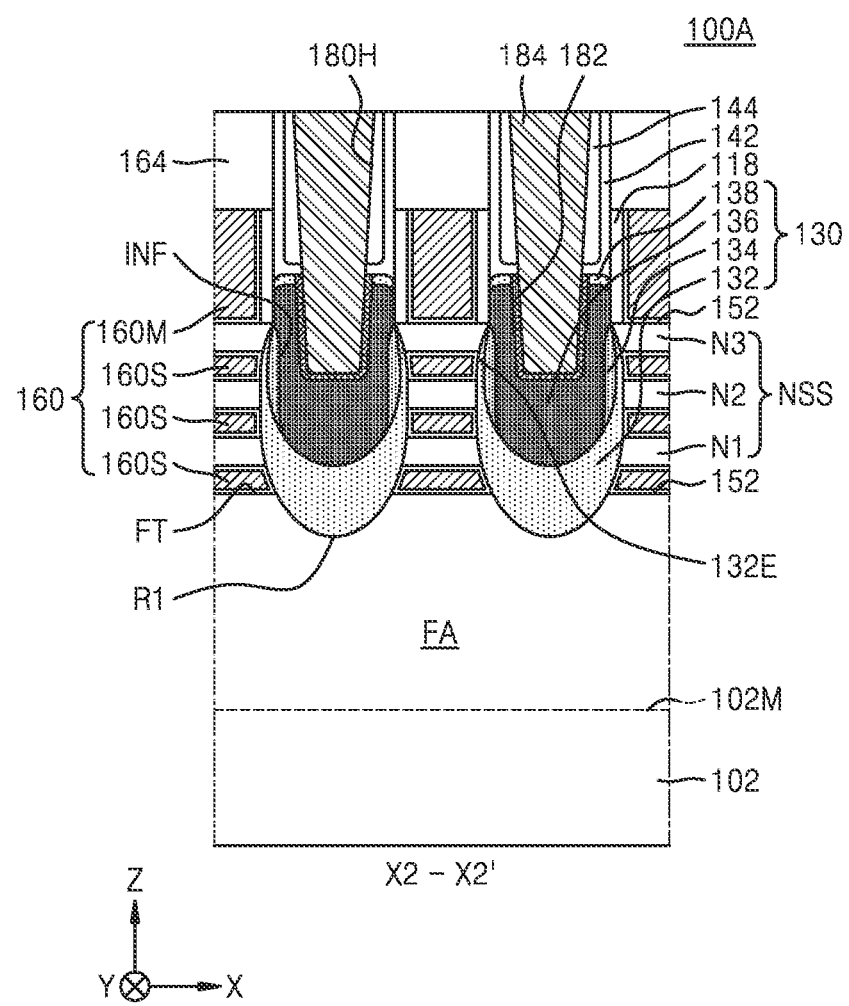
FIG. 3 is a cross-sectional view of an IC device according to exemplary embodiments.

FIG. 3 is a cross-sectional view of an IC device 100A according to exemplary embodiments. FIG. 3 illustrates some components in a portion corresponding to a cross-section taken along line X2-X2' of FIG. 1. In FIG. 3, the same reference numerals are used to denote the same elements as in FIGS. 1 and 2A to 2F, and detailed descriptions thereof are omitted as redundant.

Referring to FIG. 3, the IC device 100A may have substantially the same configuration as the IC device 100 described with reference to FIGS. 1 and 2A to 2F. However, the IC device 100A may further include a plurality of source/drain contacts 184 respectively on a plurality of source/drain regions 130. Each of the plurality of source/drain contacts 184 may extend along in a vertical direction (Z direction) between a pair of gate lines 160, which are adjacent to each other, from among a plurality of gate lines 160. A metal silicide film 182 may be disposed between the source/drain region 130 and the source/drain contact 184.

Each of the plurality of source/drain contacts 184 may fill a contact hole 180H, which passes through an inter-gate dielectric film 144 and an insulating liner 142 in the vertical direction (Z direction) and extends into the source/drain region 130. The source/drain region 130 may be separate from the source/drain contact 184 with the metal silicide film 182 disposed therebetween. The source/drain region 130 may surround a lower portion of the source/drain contact 184 outside the contact hole 180H.

In exemplary embodiments, each of the plurality of source/drain contacts 184 may include a metal, a conductive metal nitride, or a combination thereof. For example, each of the plurality of source/drain contacts 184 may include tungsten (W), copper (Cu), aluminum (Al), titanium (Ti), tantalum (Ta), titanium nitride (TiN), tantalum nitride (TaN), an alloy thereof, or a combination thereof. In other exemplary embodiments, the metal silicide film 182 may include titanium silicide, without being limited thereto. In further exemplary embodiments, the metal silicide film 182 may be omitted.

Figure 4:
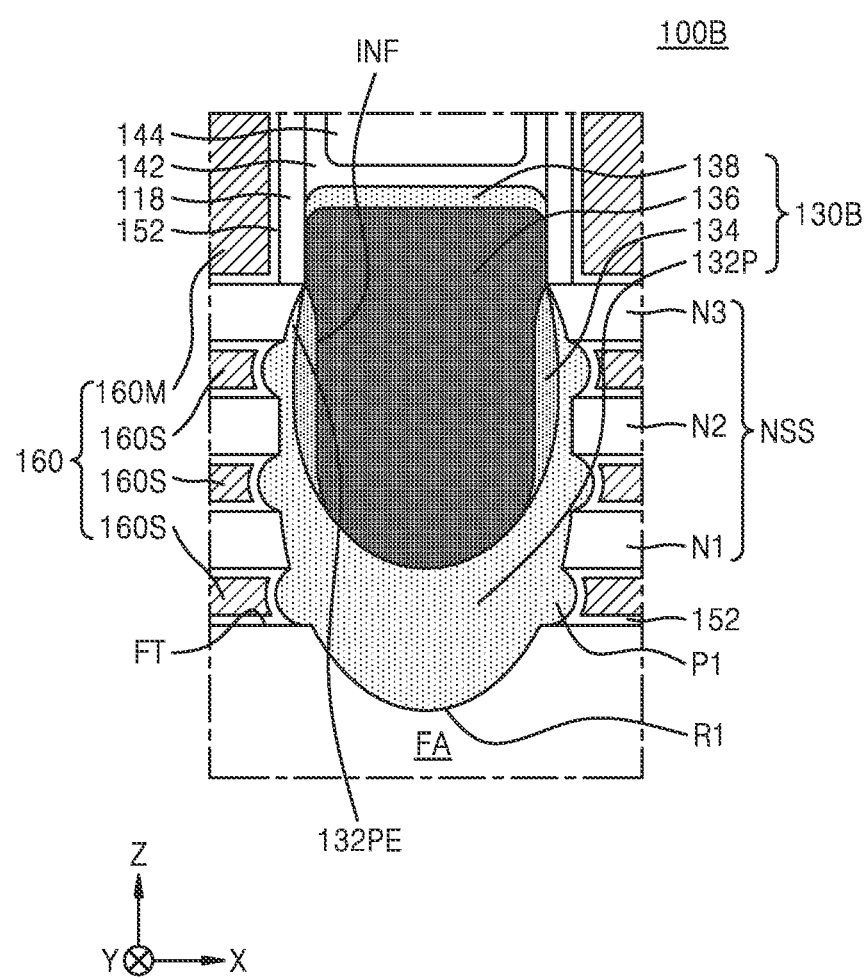
FIG. 4 is a cross-sectional view of an IC device according to exemplary embodiments.

FIG. 4 is a cross-sectional view of an IC device 100B according to exemplary embodiments. FIG. 4 illustrates an enlarged cross-sectional configuration of a region corresponding to the local region "EX1" of FIG. 2B.

Referring to FIG. 4, the IC device 100B may have substantially the same configuration as the IC device 100 described with reference to FIGS. 1 and 2A to 2F. However, the IC device 100B may include a source/drain region 130B, which fills a recess R1 in a fin-type active region FA.

The source/drain region 130B may have substantially the same configuration as the source/drain region 130 described with reference to FIGS. 2A to 2D. However, the source/drain region 130B may include a first buffer layer 132P having a plurality of protrusions P 1, which protrude toward a plurality of sub-gate portions 160S. In the source/drain region 130B, the buffer layer 132P may include a portion in contact with the first to third nanosheets N1, N2, and N3 and a portion in contact with the fin-type active region FA. The buffer layer 132P may include an edge buffer portion 132PE that is adjacent to the outer insulating spacer 118. The edge buffer portion 132PE may have a smaller thickness than other portions of the buffer layer 132P. A local buffer pattern 134 may be disposed between the edge buffer portion 132PE of the buffer layer 132P and the main body layer 136. Details of the buffer layer 132P may be the same as those of the buffer layer 132 described with reference to FIGS. 2A to 2D.

Figure 5:
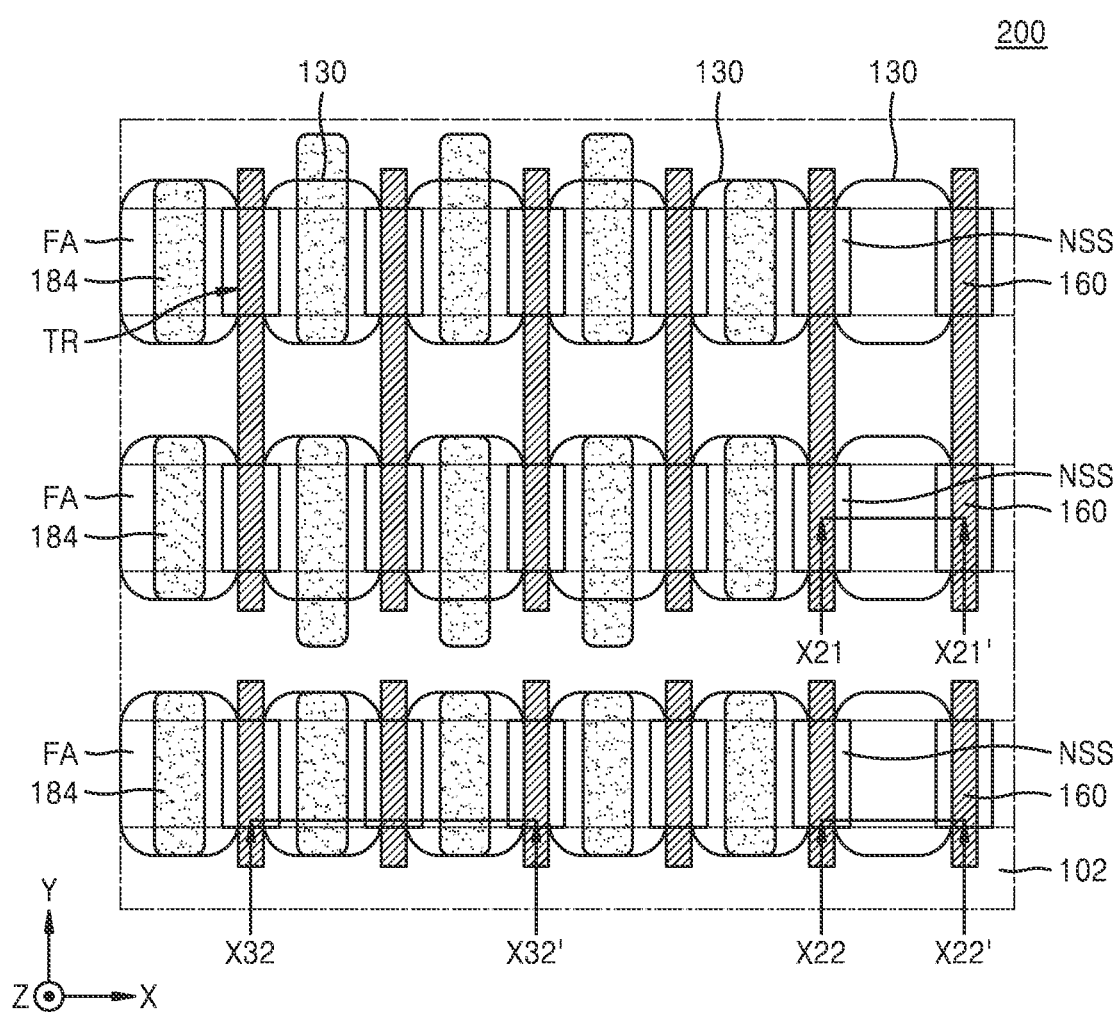
FIG. 5 is a plan layout diagram of an IC device according to exemplary embodiments.

FIG. 5 is a plan layout diagram of an IC device 200 according to exemplary embodiments. In FIG. 5, the same reference numerals are used to denote the same elements as in FIGS. 1, 2A to 2F, and 3, and detailed descriptions thereof are omitted as redundant.

Referring to FIG. 5, the IC device 200 may include a plurality of fin-type active regions FA and a plurality of gate lines 160. The plurality of fin-type active regions FA may protrude from a substrate 102 in the vertical direction (Z direction) and extend along a first lateral direction (X direction). The plurality of gate lines 160 may extend along a second lateral direction (Y direction) on the plurality of fin-type active regions FA. In regions where the plurality of fin-type active regions FA intersect with the plurality of gate lines 160, a plurality of nanosheet stacks NSS may be respectively disposed on fin top surfaces of the plurality of fin-type active regions FA. On the substrate 102, a plurality of FETs TR may be formed in the regions where the plurality of fin-type active regions FA intersect with the plurality of gate lines 160.

A plurality of source/drain regions 130 may be adjacent to the gate lines 160 on the plurality of fin-type active regions FA, and the source/drain contacts 184 may be respectively disposed on some selected from the plurality of source/drain regions 130 and connected to the source/drain regions 130. The source/drain contact 184 may be omitted on some other ones of the plurality of source/drain regions 130.

In exemplary embodiments, a sectional configuration taken along line X21-X21' of FIG. 5 may be substantially the same as a partial sectional configuration shown in FIG. 2A. In exemplary embodiments, a sectional configuration taken along line X22-X22' of FIG. 5 may be substantially the same as a partial sectional configuration shown in FIG. 2B. In other exemplary embodiments, a sectional configuration taken along line X32-X32' of FIG. 5 may be substantially the same as a sectional configuration described with reference to FIG. 3.

Figure 6:
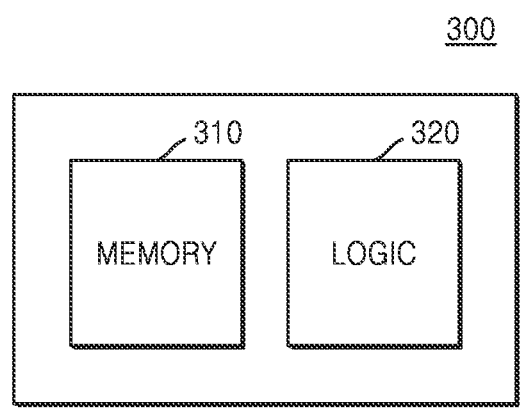
FIG. 6 is a block diagram of an IC device according to exemplary embodiments.

FIG. 6 is a block diagram of an IC device 300 according to exemplary embodiments.

Referring to FIG. 6, the IC device 300 may include a memory region 310 and a logic region 320. At least one of the memory region 310 and the logic region 320 may include at least one of configurations of the IC devices 100, 100A, 100B, and 200, which have been described with reference to FIGS. 1 to 5.

The memory region 310 may include at least one of static random access memory (SRAM), dynamic RAM (DRAM), magnetic RAM (MRAM), resistive RAM (RRAM), and phase-change RAM (PRAM). For example, the memory region 310 may include SRAM. The logic region 320 may include standard cells (e.g., counters and buffers) configured to perform desired logical functions. The standard cells may include various kinds of logic cells including a plurality of circuit elements, such as transistors and registers. The logic cell may include an AND, a NAND, an OR, a NOR, an exclusive OR (XOR), an exclusive NOR (XNOR), an inverter (INV), an adder (ADD), a buffer (BUF), a delay (DLY), a filter (FIL), a multiplexer (MXT/MXIT), an OR/AND/INVERTER (OAI), an AND/OR (AO), an AND/OR/INVERTER (AOI), a D-flip-flop, a reset flip-flop, a master-slave flip-flop, and/or a latch.

In the IC devices 100, 100A, 100B, 200, and 300 according to the exemplary embodiments described with reference to FIGS. 1 to 6, the source/drain region 130 constituting the FET TR may include the buffer layer 132 and the local buffer pattern 134 partially covering a portion of the buffer layer 132, which has a relatively small thickness, at a position adjacent to the outer insulating spacer covering the sidewall of the gate line 160. In the source/drain region 130, the function of the buffer layer 132 may be supplemented and/or reinforced by the local buffer pattern 134. In addition, in the buffer layer 132 of the source/drain region 130, a portion that may be vulnerable to an attack from the exterior may be selectively reinforced by the local buffer pattern 134. Accordingly, during the manufacture of the IC devices 100, 100A, 100B, 200, and 300, failures, such as the deterioration of the source/drain region 130 by external attacks or the occurrence of a short circuit between the source/drain region 130 and a conductive region adjacent thereto, may be prevented, and the reliability of the IC devices 100, 100A, 100B, 200, and 300 may be improved.

FIGS. 7 to 19B are cross-sectional views of a process sequence of a method of manufacturing an IC device, according to exemplary embodiments. More specifically, FIGS. 7, 8, 9, 10A, 11A, 12A, 13A, 14A, 15A, 16A, 17A, 18A, and 19A are cross-sectional views of example sectional structures of a portion corresponding to the cross-section taken along line X1-X1' of FIG. 1, according to a process sequence. FIGS. 10B, 11B, 12B, 13B, 14B, 15B, 16B, 17B, 18B, and 19B are cross-sectional views of exemplary sectional structures of a portion corresponding to the cross-ssection taken along line X2-X2' of FIG. 1, according to a process sequence. FIGS. 10C, 11C, 12C, and 13C are enlarged plan views of some components at a vertical level LV1 corresponding to the cross-section taken along line LV1-LV1 of FIG. 2A, according to a process sequence. An exemplary method of manufacturing the IC device 100 shown in FIGS. 1 and 2A to 2F will now be described with reference to FIGS. 7 to 19B. In FIGS. 7 to 19B, the same reference numerals are used to denote the same elements as in FIGS. 1 and 2A to 2F, and detailed descriptions thereof are omitted as omitted.

Figure 7:
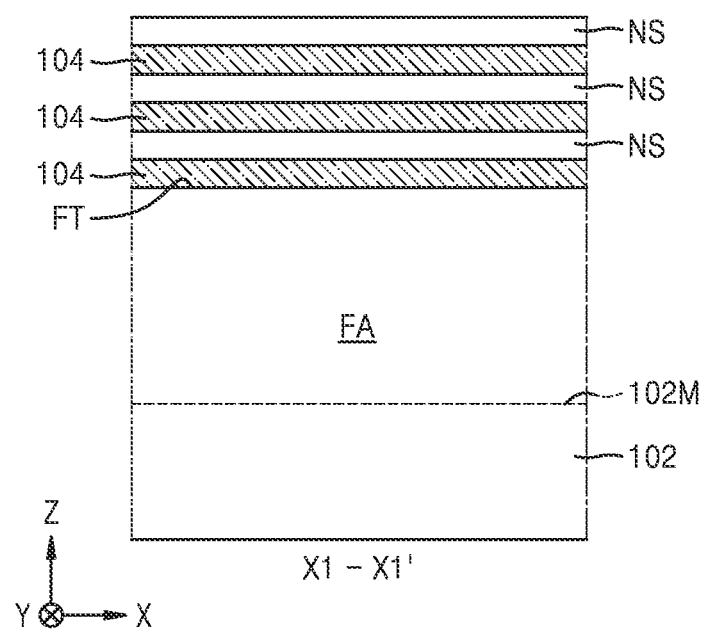

Referring to FIG. 7, a plurality of sacrificial semiconductor layers 104 and a plurality of nanosheet semiconductor layers NS may be alternately stacked one-by-one on a substrate 102. Portions of the plurality of sacrificial semiconductor layers 104, the plurality of nanosheet semiconductor layers NS, and the substrate 102 may be etched to define a plurality of fin-type active regions FA in the substrate 102. Thereafter, a device isolation film (see 114 in FIG. 1) may be formed to cover sidewalls of each of the plurality of fin-type active regions FA. The stack structure of the plurality of sacrificial semiconductor layers 104 and the plurality of nanosheet semiconductor layers NS may remain on the fin top surface FT of each of the plurality of fin-type active regions FA.

The plurality of sacrificial semiconductor layers 104 and the plurality of nanosheet semiconductor layers NS may include semiconductor materials having different etch rates. In exemplary embodiments, the plurality of nanosheet semiconductor layers NS may include a silicon (Si) layer, and the plurality of sacrificial semiconductor layers 104 may include a silicon germanium (SiGe) layer. In other exemplary embodiments, the plurality of sacrificial semiconductor layers 104 may have a constant Ge content. The SiGe layer included in the plurality of sacrificial semiconductor layers 104 may have a constant Ge content, which is selected in a range of about 5 at % to about 60 at %, for example, about 10 at % to about 40 at %. The Ge concentration of the SiGe layer included in the plurality of sacrificial semiconductor layers 104 may be variously selected as needed.

Figure 8:
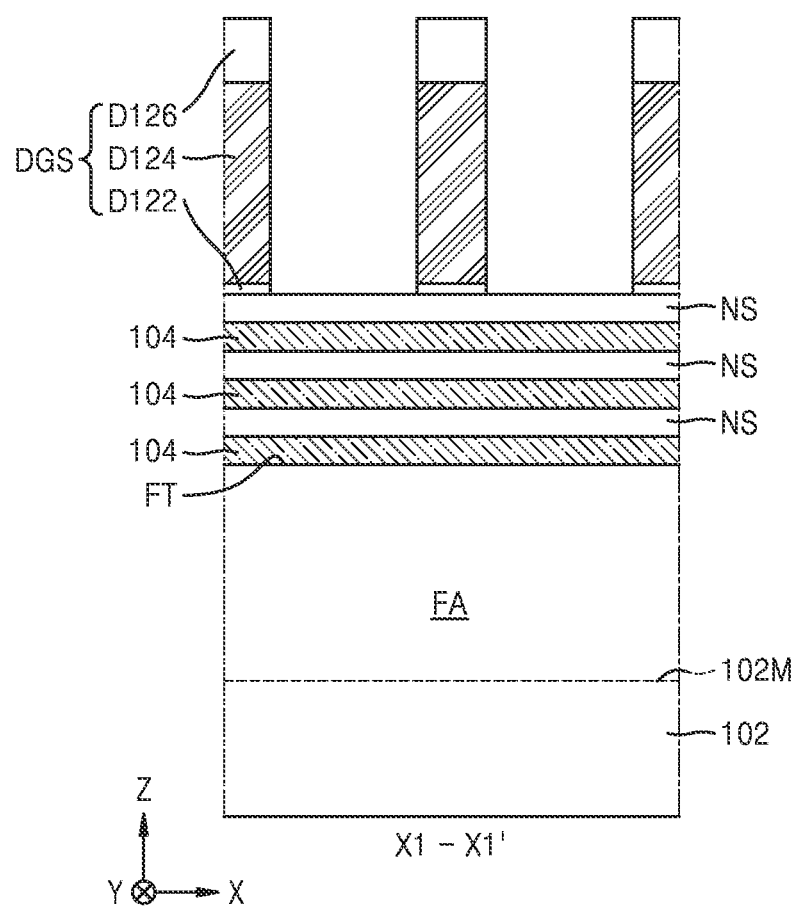

Referring to FIG. 8, a plurality of dummy gate structures DGS may be formed on the stack structure of the plurality of sacrificial semiconductor layers 104 and the plurality of nanosheet semiconductor layers NS.

Each of the plurality of dummy gate structures DGS may be formed to extend along a second lateral direction (Y direction). Each of the plurality of dummy gate structures DGS may have a structure in which an oxide film D122, a dummy gate layer D124, and a capping layer D126 are sequentially stacked. In exemplary embodiments, the dummy gate layer D124 may include polysilicon, and the capping layer D126 may include a silicon nitride film.

Figure 9:
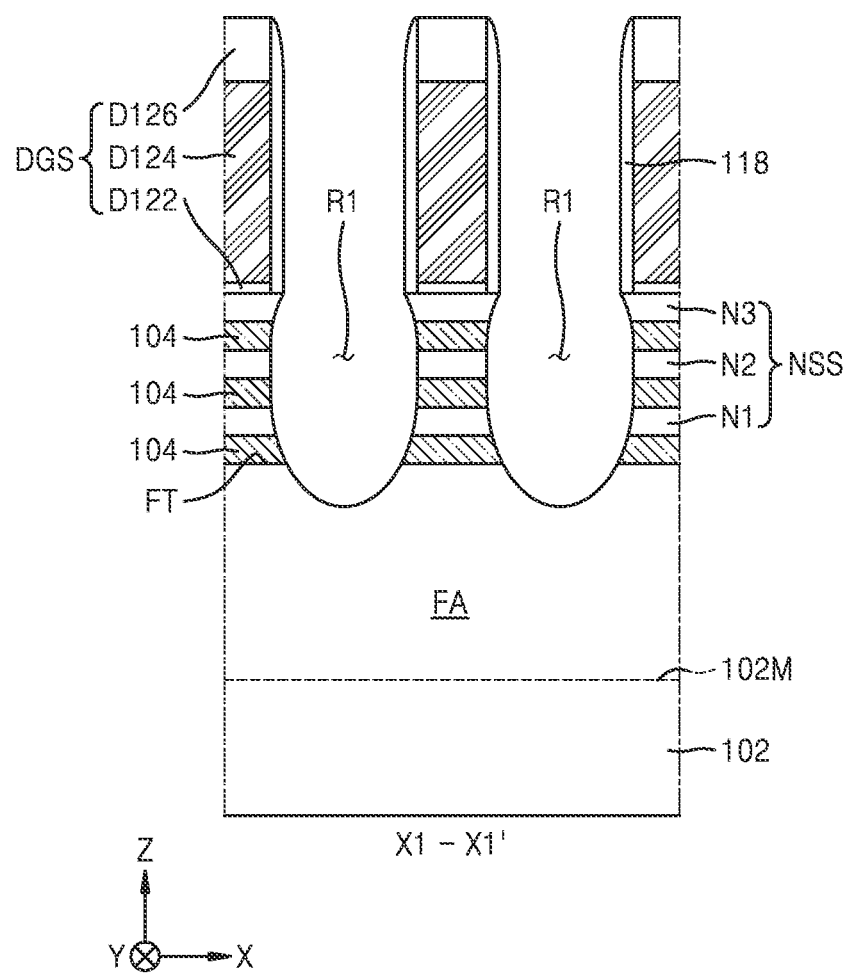

Referring to FIG. 9, a plurality of outer insulating spacers 118 may be formed to cover both sidewalls of each of the plurality of dummy gate structures DGS. Thereafter, respective portions of the plurality of sacrificial semiconductor layers 104 and the plurality of nanosheet semiconductor layers NS and portions of the fin-type active region FA may be etched using the plurality of dummy gate structures DGS and the plurality of outer insulating spacers 118 as etch masks, and thus, the plurality of nanosheet semiconductor layers NS may be divided into a plurality of nanosheet stacks NSS, and a plurality of recesses R1 may be formed in an upper portion of the fin-type active region FA. Each of the plurality of nanosheet stacks NSS may include a first nanosheet N1, a second nanosheet N2, and a third nanosheet N3. The plurality of recesses R1 may be etched using a dry etching process, a wet dry etching process or a combination thereof.

Figure 10A:
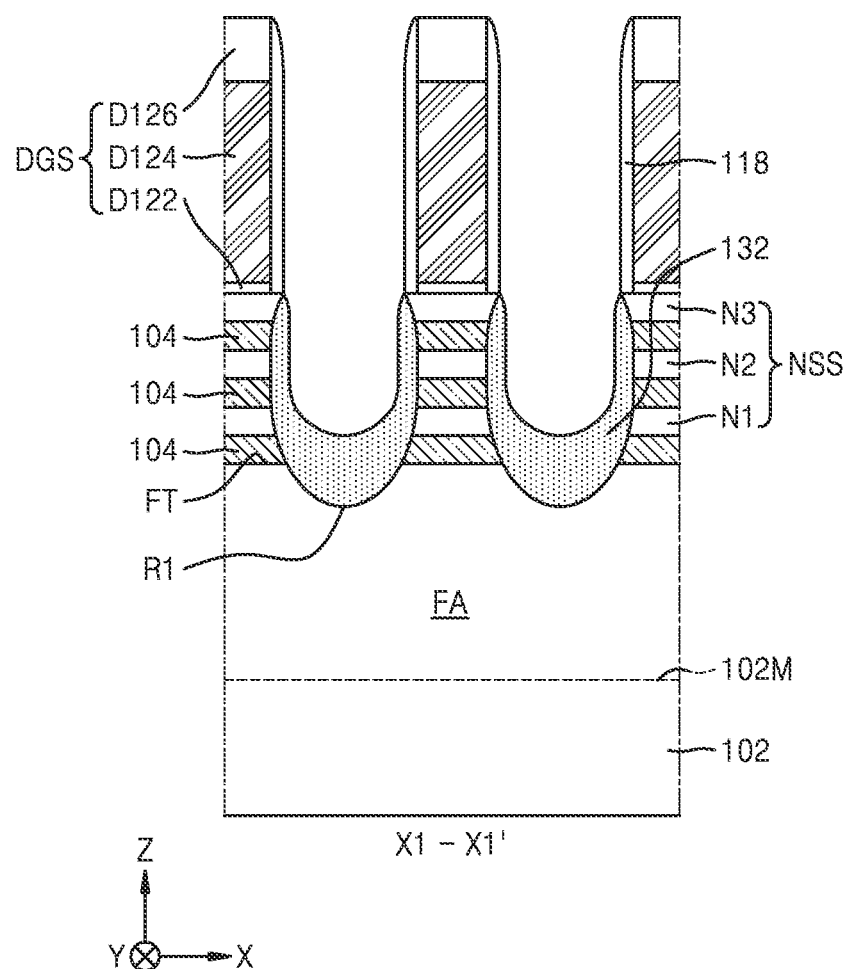
Figure 10B:
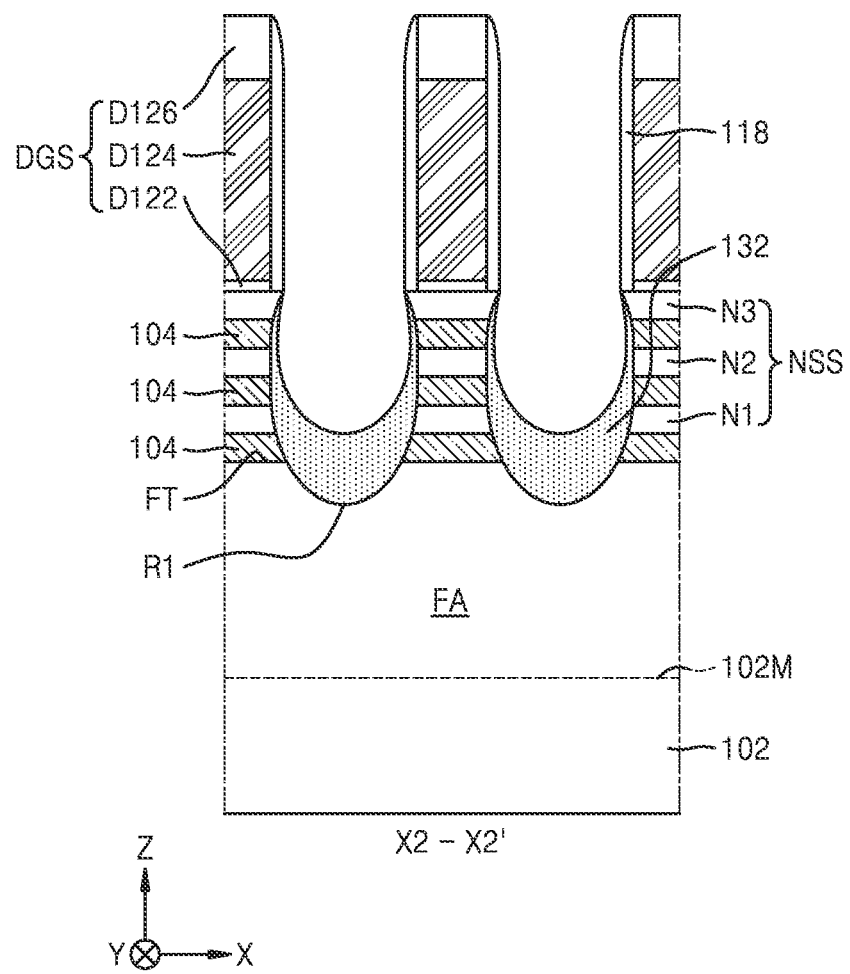
Figure 10C:
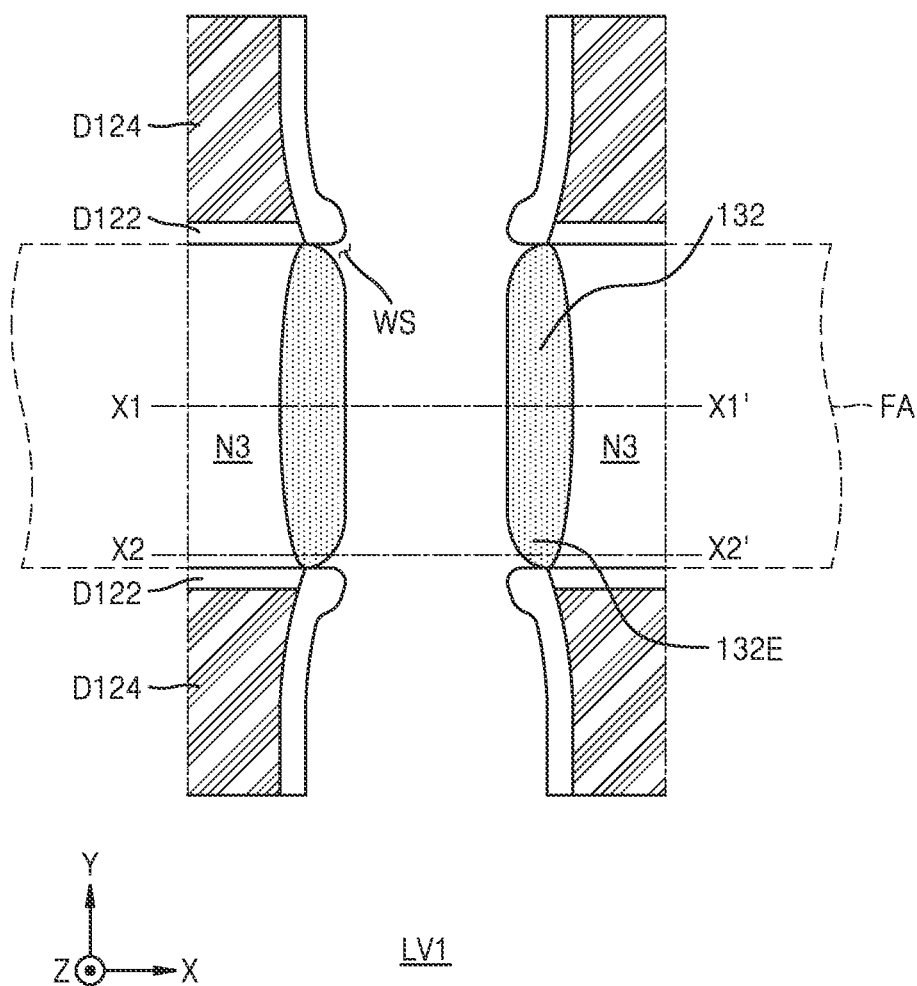
FIGS. 10C, 11C, 12C, and 13C are enlarged plan views of some components at a vertical level LV1 corresponding to the cross-section taken along line LV1-LV1 of FIG. 2A, according to a process sequence.

Referring to FIGS. 10A, 10B, and 10C, a buffer layer 132 may be formed on both sides of each of the plurality of nanosheet stacks NSS on the fin-type active region FA.

In exemplary embodiments, to form the buffer layer 132, a semiconductor material may be epitaxially grown from a surface of the fin-type active region FA exposed at a bottom surface of the recess R1, sidewalls of each of the first to third nanosheets N1, N2, and N3 in the nanosheet stack NSS, and sidewalls of each of the plurality of sacrificial semiconductor layers 104.

In exemplary embodiments, to form the buffer layer 132, a low-pressure chemical vapor deposition (LPCVD) process, a selective epitaxial growth (SEG) process, or a cyclic deposition and etching (CDE) process may be performed by using source materials including an element semiconductor precursor. The element semiconductor precursor may include a silicon (Si) source and a germanium (Ge) source.

In exemplary embodiments, to form the buffer layer 132, the Si source and the Ge source may be used. Silane ($SiH_4$), disilane ($Si_2H_6$), trisilane ($Si_3H_8$), and/or dichlorosilane ($SiH_2Cl_2$) may be used as the silicon source, without being limited thereto. Germane ($GeH_4$), digermane ($Ge_2H_6$), trigermane ($Ge_3H_8$), tetragermane ($Ge_4H_{10}$), and/or dichlorogermane ($Ge_2H_2Cl_2$) may be used as the Ge source, without being limited thereto. When the buffer layer 132 includes a SiGe layer doped with boron (B) atoms, diborane ($B_2H_6$), triborane, tetraborane, and/or pentaborane may be used as a B source, without being limited thereto.

Thus, during the formation of the buffer layer 132, a portion of the buffer layer 132, which is adjacent to the outer insulating spacer 118, may have a relatively small thickness due to a facet growth mode that occurs in the portion of the buffer layer 132, which is adjacent to the outer insulating spacer 118. Accordingly, as shown in FIG. 10C, the buffer layer 132 may be formed to include an edge buffer portion 132E adjacent to the outer insulating spacer 118. The edge buffer portion 132E may have a smaller thickness than other portions of the buffer layer 132. After the buffer layer 132 is formed, a wedge-type space WS may be defined by the edge buffer portion 132E of the buffer layer 132 and the outer insulating spacer 118.

In exemplary embodiments, the epitaxial growth process for forming the buffer layer 132 may be performed at a temperature that is selected in a range of about 600° C. to about 620° C., without being limited thereto.

Figure 11A:
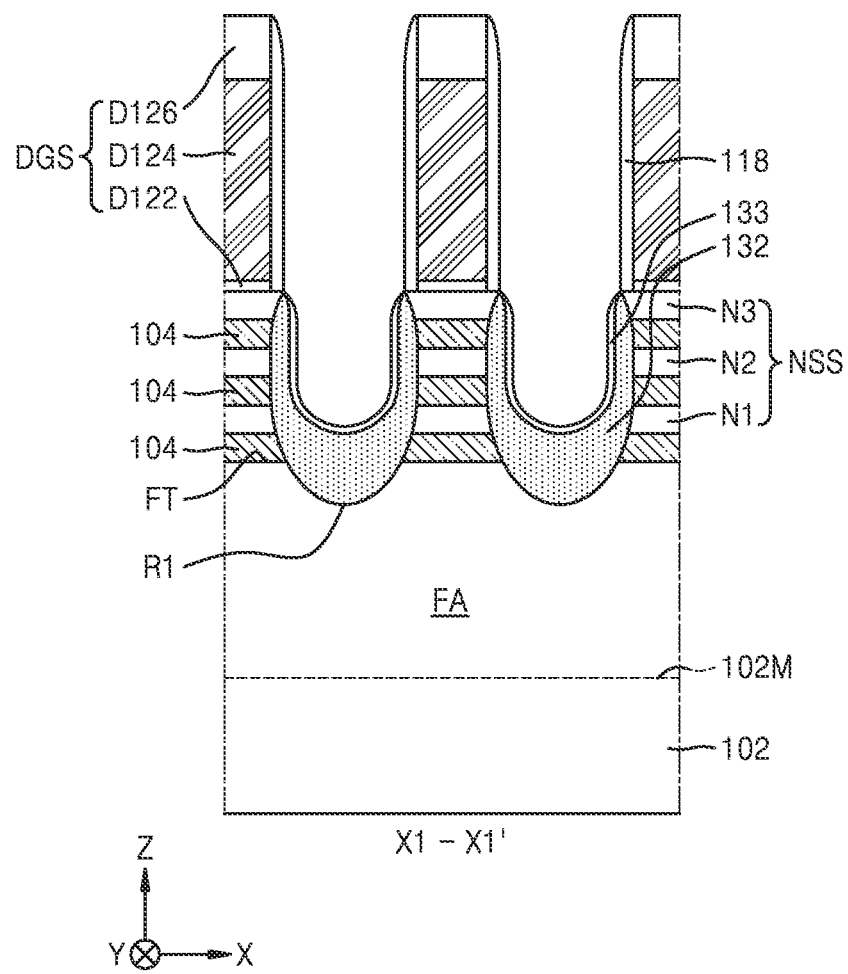
Figure 11B:
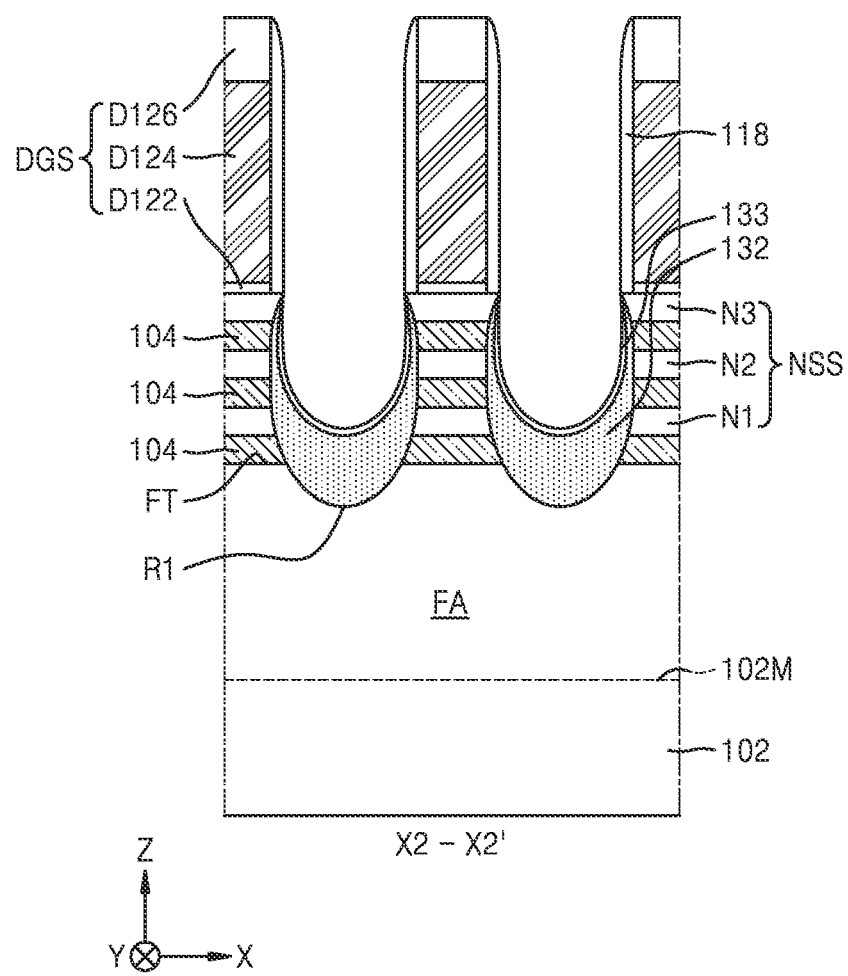
Figure 11C:
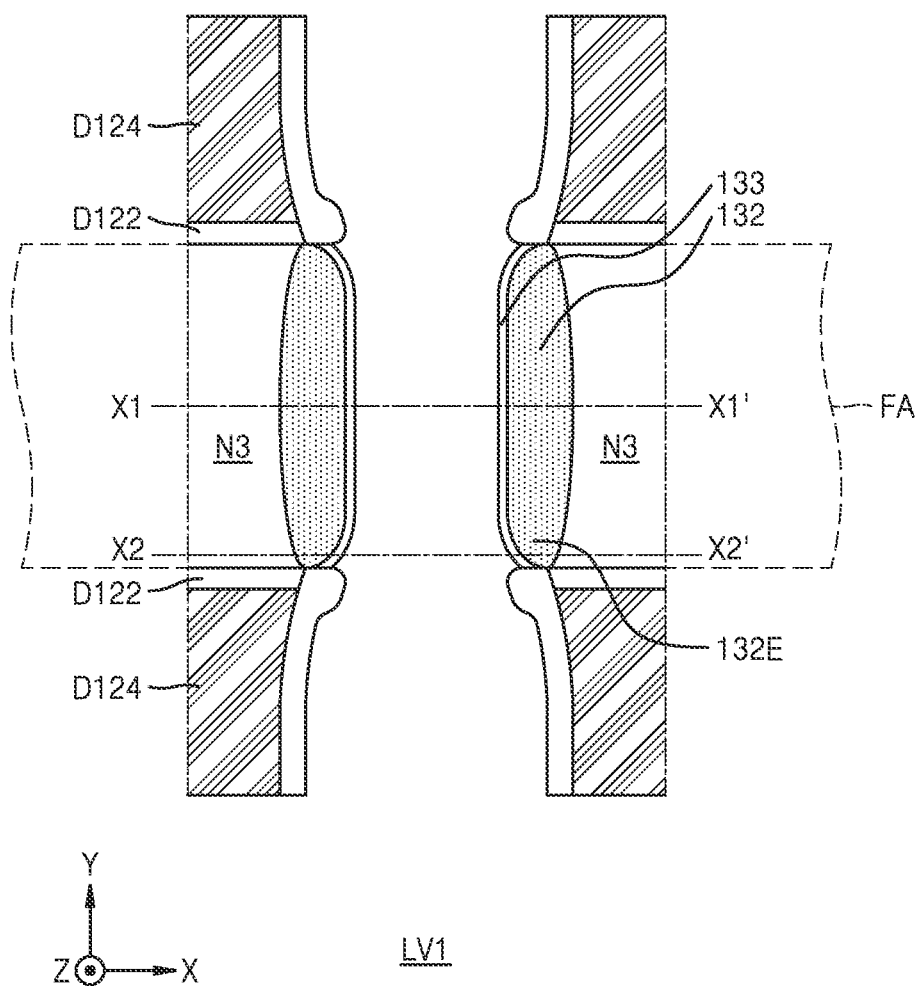

Referring to FIGS. 11A, 11B, and 11C, in the resultant structure of FIGS. 10A, 10B, and 10C, a preliminary buffer liner 133 may be formed to conformally cover an exposed surface of the buffer layer 132.

In exemplary embodiments, to form the preliminary buffer liner 133, a process that is substantially similar to the process of forming the buffer layer 132, which has been described with reference to FIGS. 10A, 10B, and 10C, may be performed. However, a partial pressure of each of a Si source, a Ge source, and a B source, which are supplied onto the substrate 102 to form the preliminary buffer liner 133, may be appropriately controlled such that a Ge content of the preliminary buffer liner 133 becomes different from a Ge content of the buffer layer 132. In other exemplary embodiments, the preliminary buffer layer 133 may be formed such that the Ge content of the preliminary buffer liner 133 is higher than the Ge content of the buffer layer 132. In still other exemplary embodiments, the preliminary buffer layer 133 may be formed such that the Ge content of the preliminary buffer liner 133 is lower than the Ge content of the buffer layer 132. In exemplary embodiments, the preliminary buffer liner 133 may be formed such that the buffer layer 132 and the preliminary buffer liner 133 have the same dopant concentration (e.g., boron (B) concentration) as each other. In other exemplary embodiments, the preliminary buffer liner 133 may be formed to have a thickness that is selected in a range of about 1 nm to about 3 nm or a range of about 1 nm to about 2 nm, without being limited thereto.

In exemplary embodiments, a process temperature in an epitaxial growth process for forming the preliminary buffer liner 133 may be substantially equal to the process temperature in the epitaxial growth process for forming the buffer layer 132, which has been described with reference to FIGS. 10A, 10B, and 10C. In other exemplary embodiments, the process temperature in the epitaxial growth process for forming the preliminary buffer liner 133 may be lower than the process temperature in the epitaxial growth process for forming the buffer layer 132. In exemplary embodiments, the epitaxial growth process for forming the preliminary buffer liner 133 may be performed at a temperature that is selected in a range of about 560° C. to about 590° C., without being limited thereto.

Figure 12A:
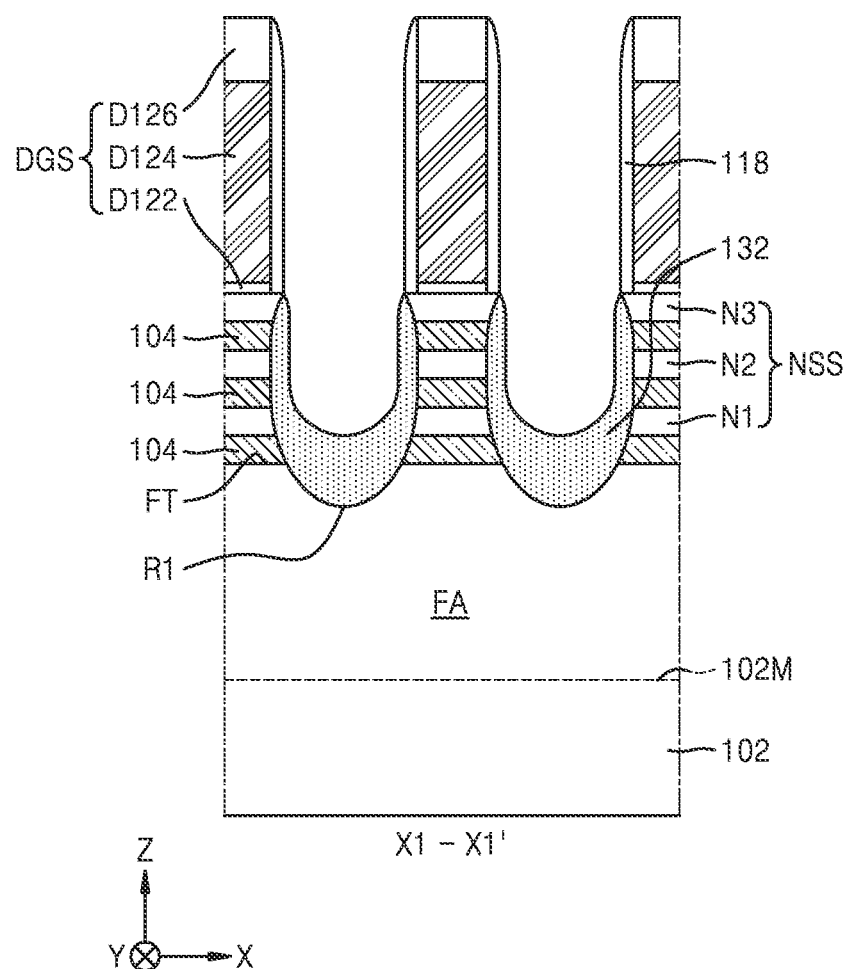
Figure 12B:
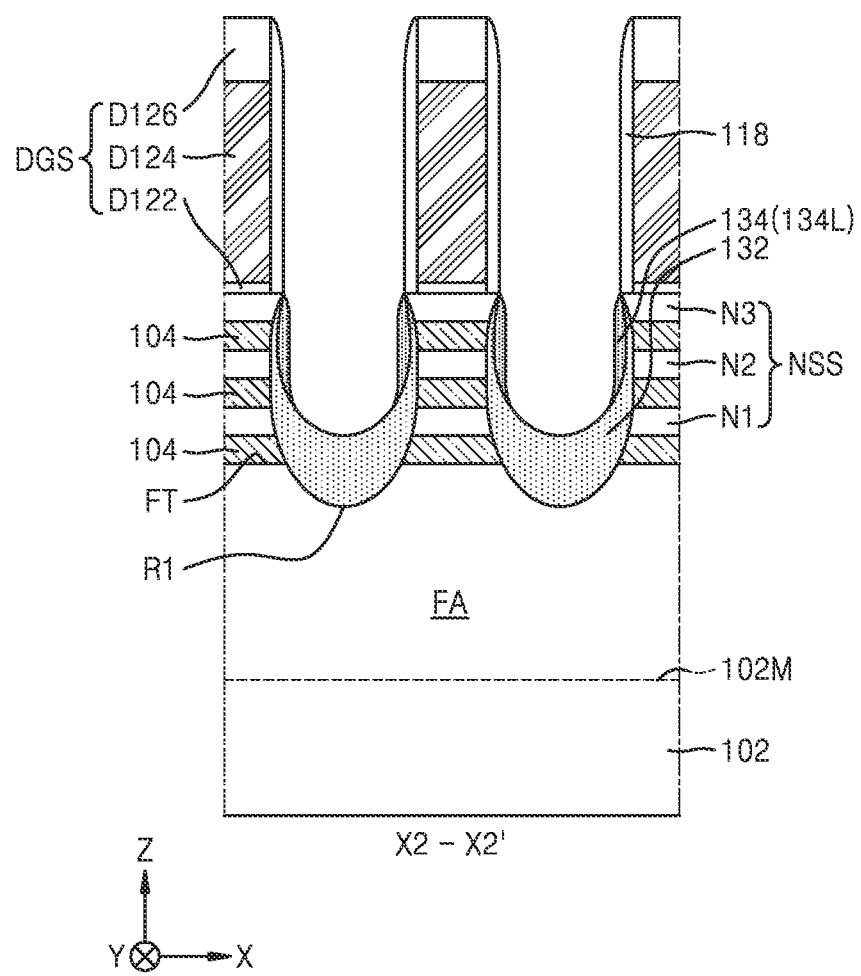
Figure 12C:
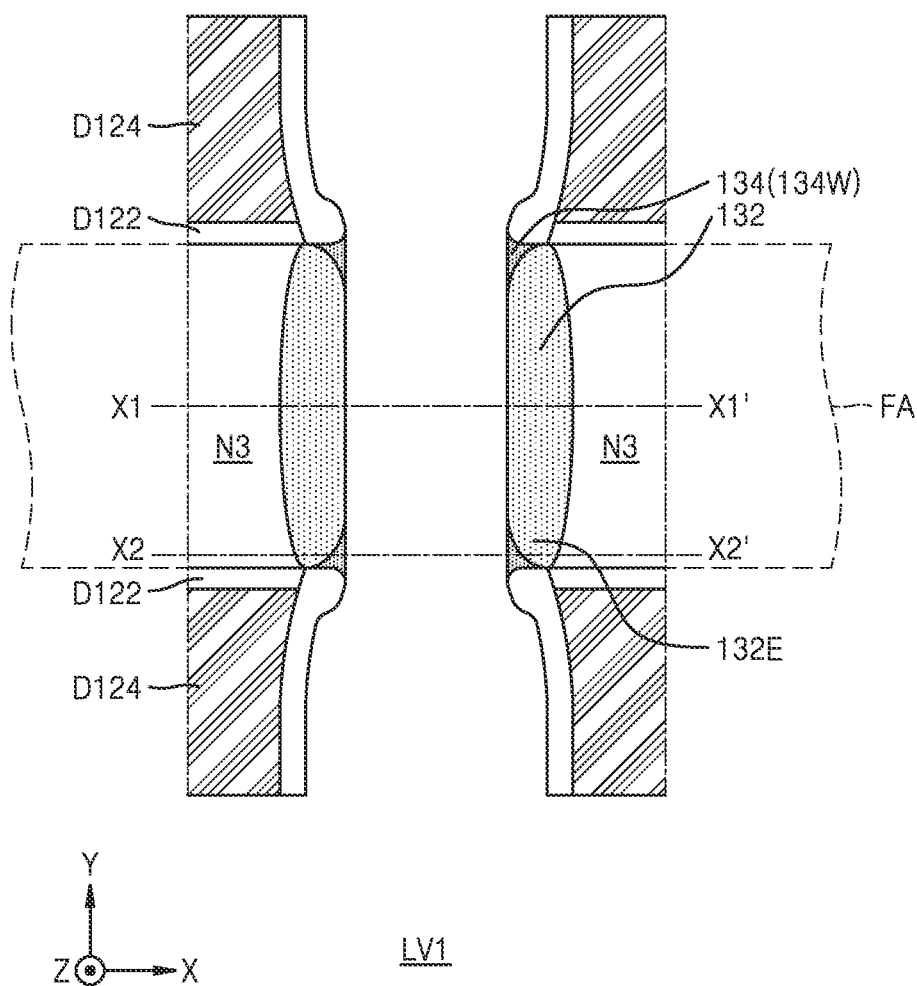

Referring to FIGS. 12A, 12B, and 12C, a reflow process may be performed on the preliminary buffer liner 133 in the resultant structure of FIGS. 11A, 11B, and 11C, and thus, a plurality of local buffer patterns 134 may be formed from the preliminary buffer liner 133.

More specifically, the resultant structure of FIGS. 11A, 11B, and 11C on which the preliminary buffer liner 133 is formed may be annealed. As a result, in the resultant structure of FIGS. 11A, 11B, and 11C, the preliminary buffer liner 133 that is exposed to the outside may be reflowed to reduce a surface area of a structure including the buffer layer 132 and the preliminary buffer liner 133, which are in the recess R1, and the resultant structure in which the preliminary buffer liner 133 is reflowed may be collected on portions of the buffer layer 132, which have relatively small thicknesses. As a result, a plurality of local buffer patterns 134, each of which includes a wedge portion 134W and a liner portion 134L, may be formed. The wedge portion 134W may fill the wedge-type space (see WS in FIG. 10C) that is defined by the edge buffer portion 132E of the buffer layer 132 and the outer insulating spacer 118. The liner portion 134L may be integrally connected to the wedge portion 134W and cover a portion of the buffer layer 132, which has a relatively small thickness, in a region adjacent to the wedge portion 134W.

In exemplary embodiments, when the preliminary buffer liner 133 has a higher Ge content than the buffer layer 132, reflow characteristics of the preliminary buffer liner 133 due to an annealing process may be improved. In other exemplary embodiments, an annealing temperature for forming the plurality of local buffer patterns 134 from the preliminary buffer liner 133 may be higher than the process temperature for forming the preliminary buffer liner 133, which has been described with reference to FIGS. 11A, 11B, and 11C. For example, the annealing temperature for forming the plurality of local buffer patterns 134 from the preliminary buffer liner 133 may be higher by about 80° C. to about 120° C. or about 90° C. to about 110° C. (e.g., about 100° C.) than the process temperature for forming the preliminary buffer liner 133, which has been described with reference to FIGS. 11A, 11B, and 11C, without being limited thereto.

While the preliminary buffer liner 133 is being reflowed by annealing the resultant structure including the preliminary buffer liner 133, some of the elements (e.g., boron) of a p-type dopant in the preliminary buffer liner 133 may migrate to an exposed surface of the recess R1. As a result, after the plurality of local buffer patterns 134 are formed, an exposed surface of each of the plurality of local buffer patterns 134 may include the p-type dopant (e.g., boron) at a higher concentration relative to other portions of each of the plurality of local buffer patterns 134.

Figure 13A:
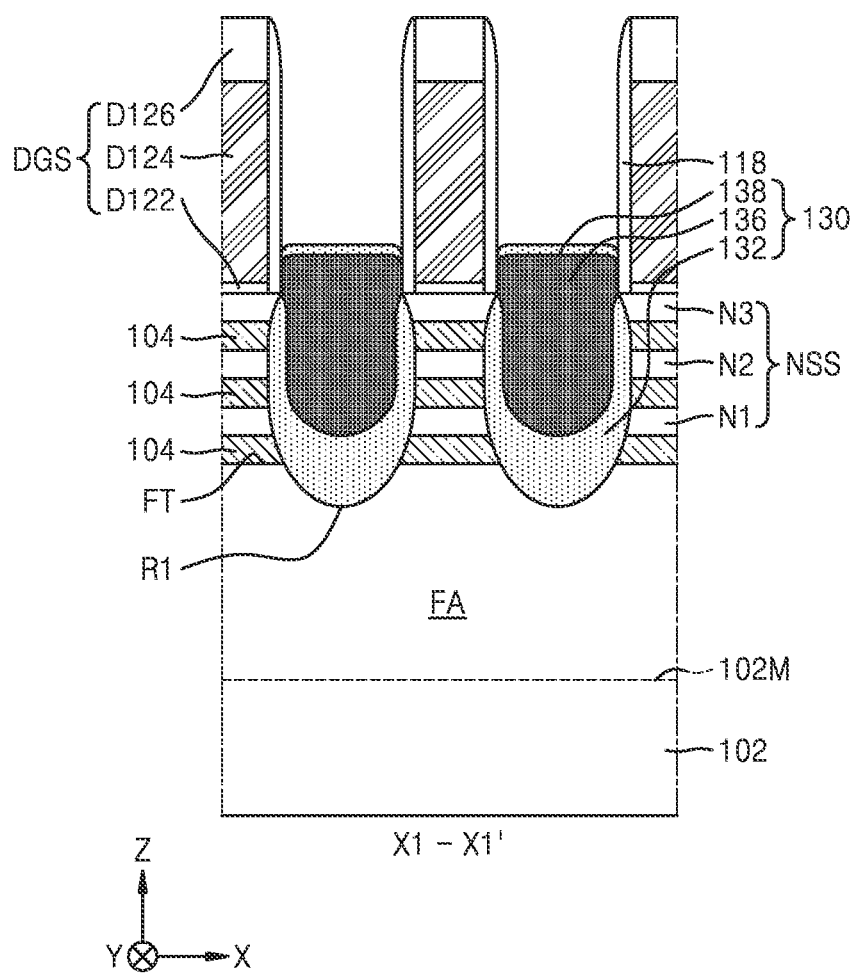
Figure 13B:
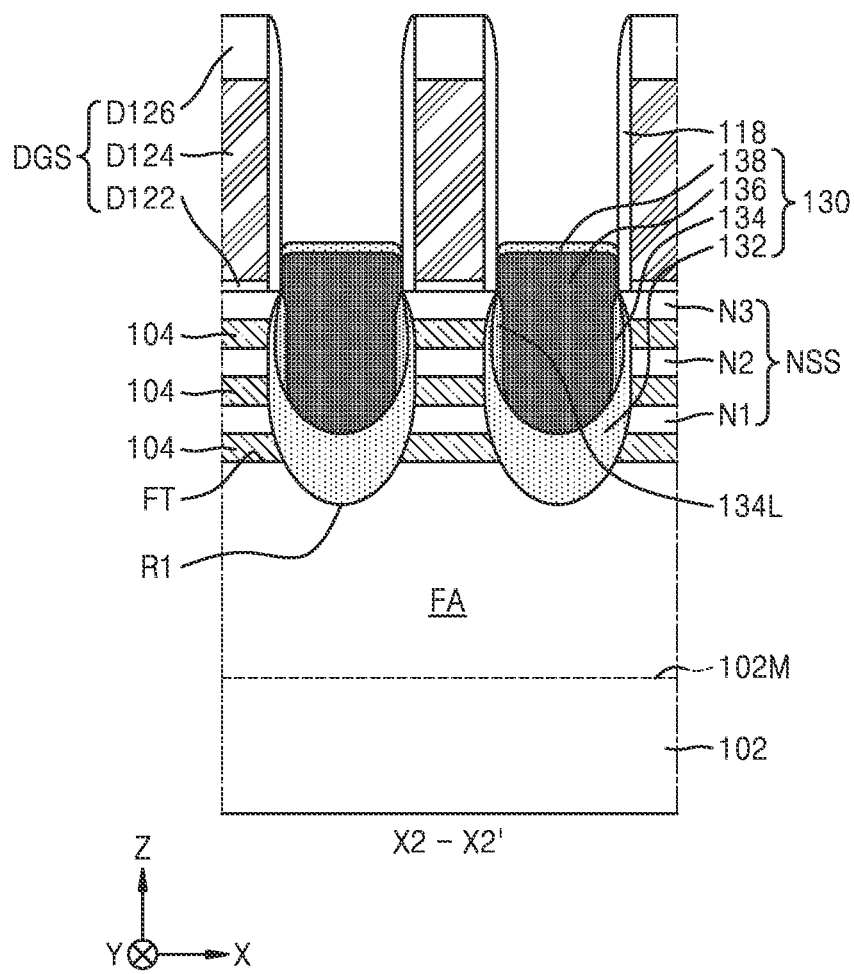
Figure 13C:
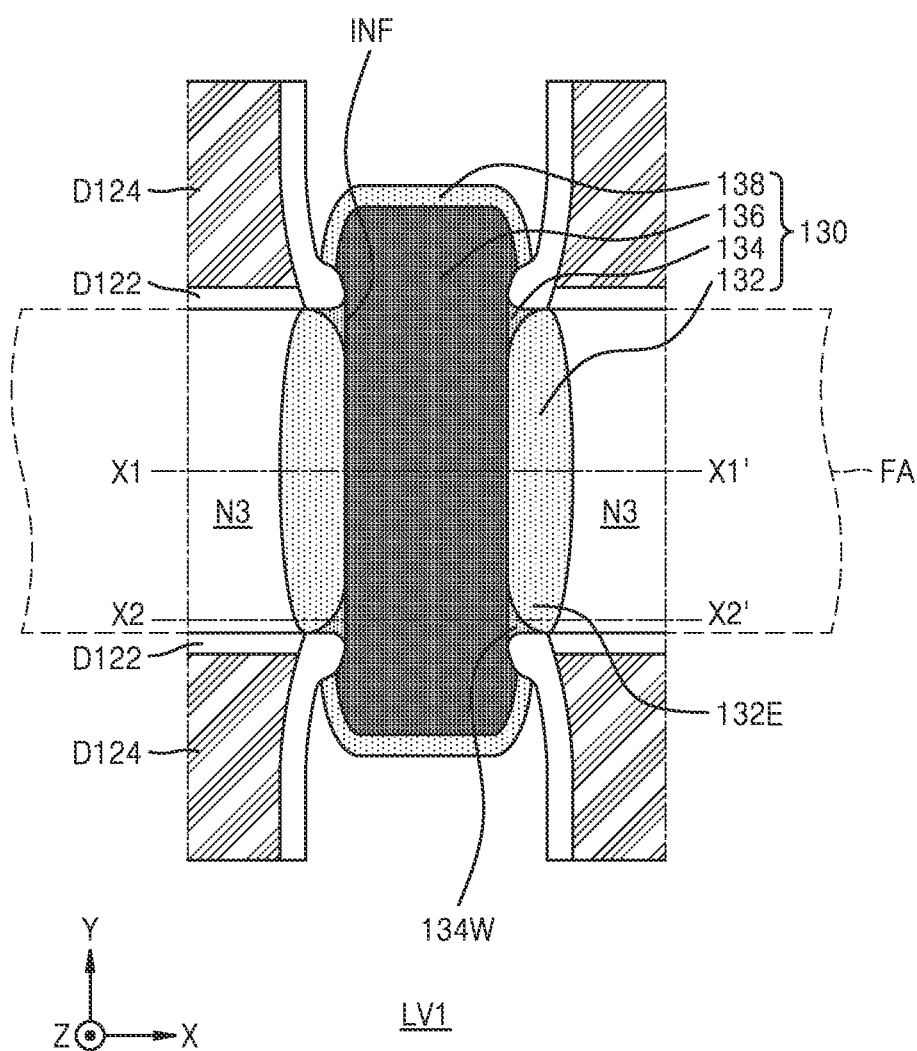

Referring to FIGS. 13A, 13B, and 13C, in the resultant structure of FIGS. 12A, 12B, and 12C, a main body layer 136 and a capping layer 138 may be sequentially formed on the resultant structure including the plurality of local buffer patterns 134, and thus, a plurality of source/drain regions 130 may be formed.

To form the main body layer 136 and the capping layer 138, processes that are substantially similar to the process of forming the buffer layer 132, which has been described with reference to FIGS. 10A, 10B, and 10C, may be performed. However, a process temperature in an epitaxial growth process for forming the main body 136 may be lower than a process temperature in an epitaxial growth process for forming the buffer layer 132. In exemplary embodiments, the epitaxial growth process for forming the main body layer 136 may be performed at a temperature of about 550° C. to about 580° C., for example, about 570° C., without being limited thereto. In other exemplary embodiments, to form the main body layer 136, a Si source, a Ge source, and a B source may be used.

In the plurality of source/drain regions 130, the concentration of the p-type dopant in an interfacial portion INF between the local buffer pattern 134 and the main body layer 136 may be higher than the concentration of the p-type dopant in other portions of the source/drain region 130.

Figure 14A:
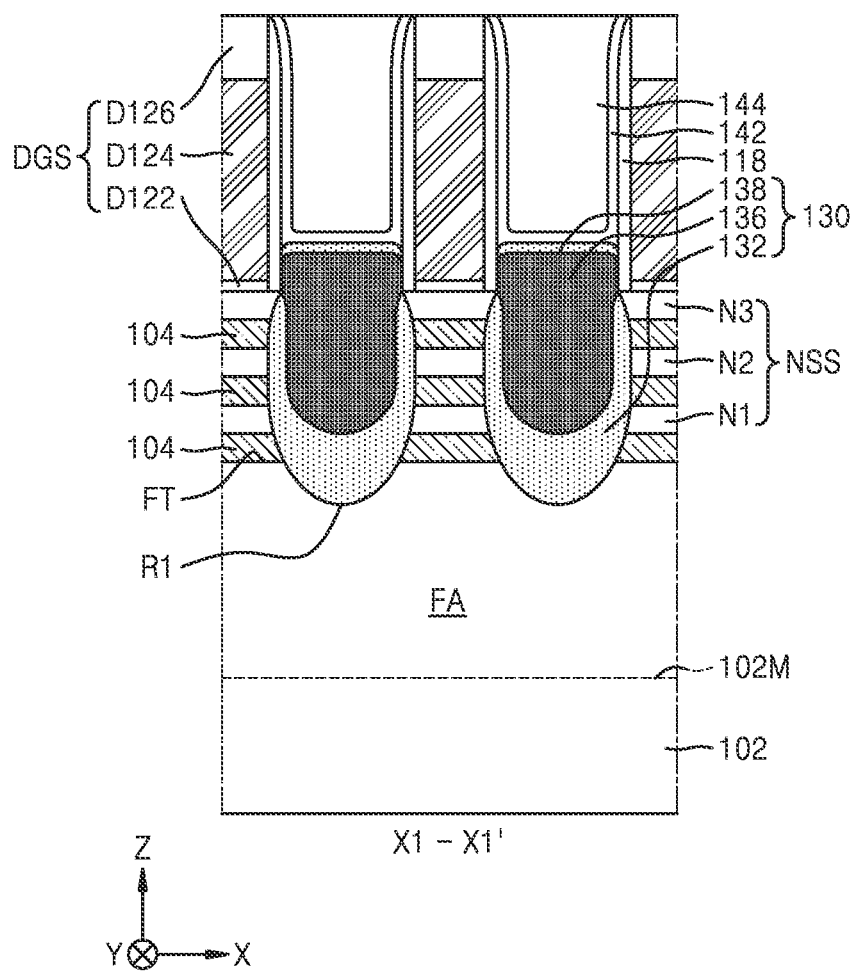
Figure 14B:
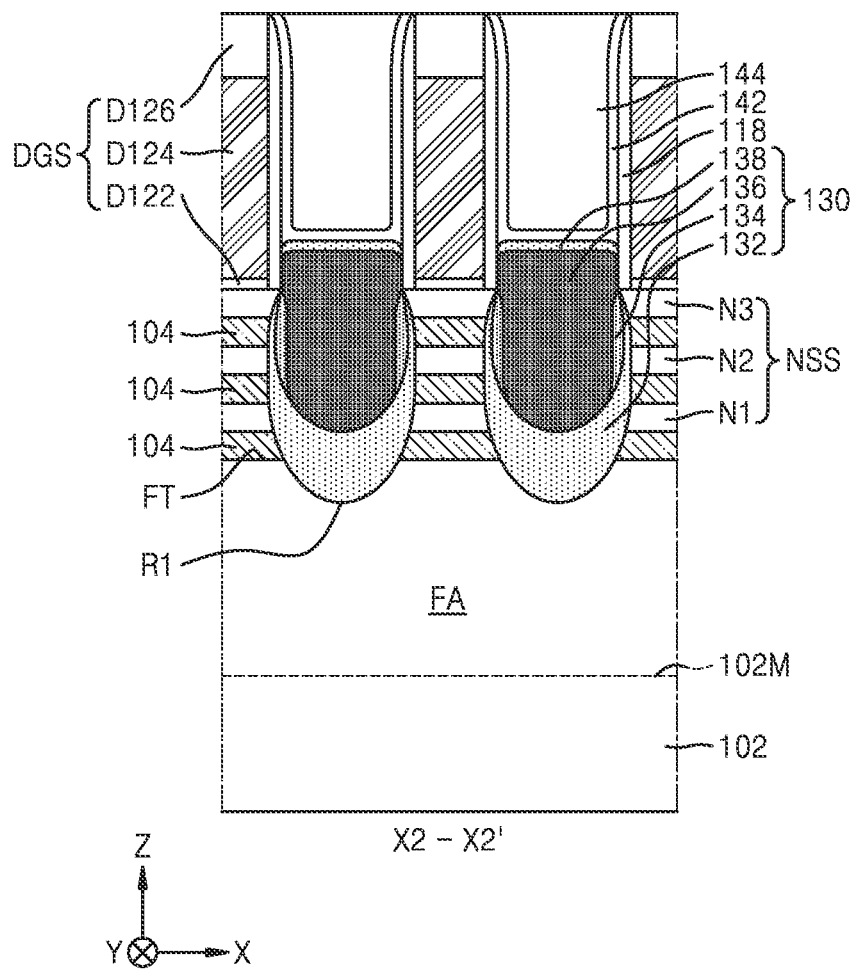

Referring to FIGS. 14A and 14B, an insulating liner 142 may be formed to cover the resultant structure of FIGS. 13A, 13B, and 13C in which the plurality of source/drain regions 130 are formed, and an inter-gate dielectric film 144 may be formed on the insulating liner 142. The insulating liner 142 and the inter-gate dielectric film 144 may be planarized to expose a top surface of the capping layer D126.

Figure 15A:
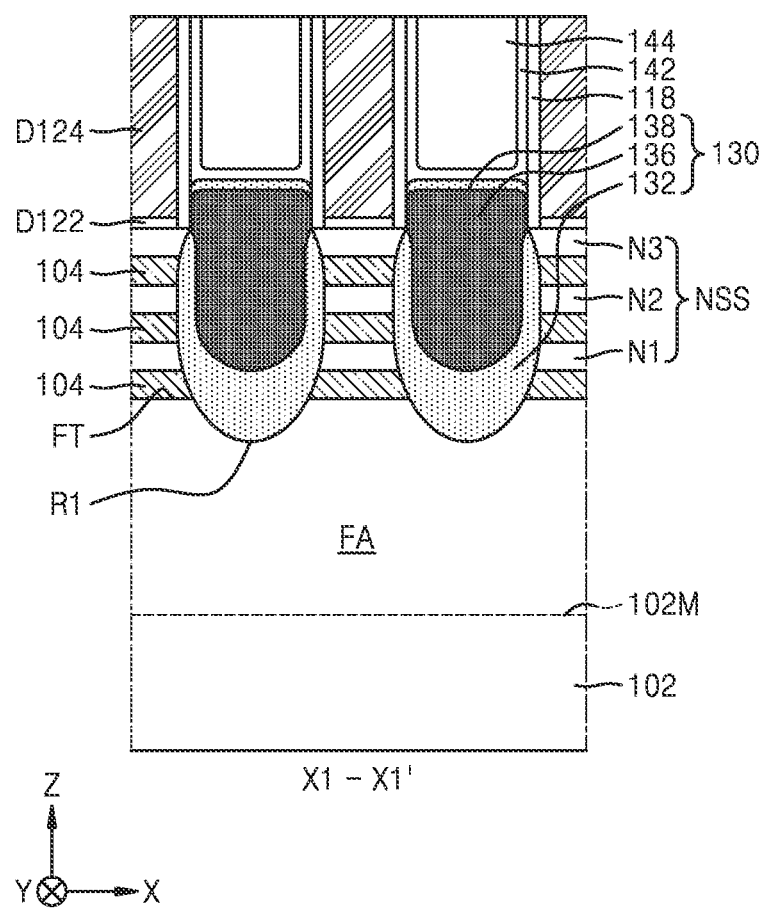
Figure 15B:
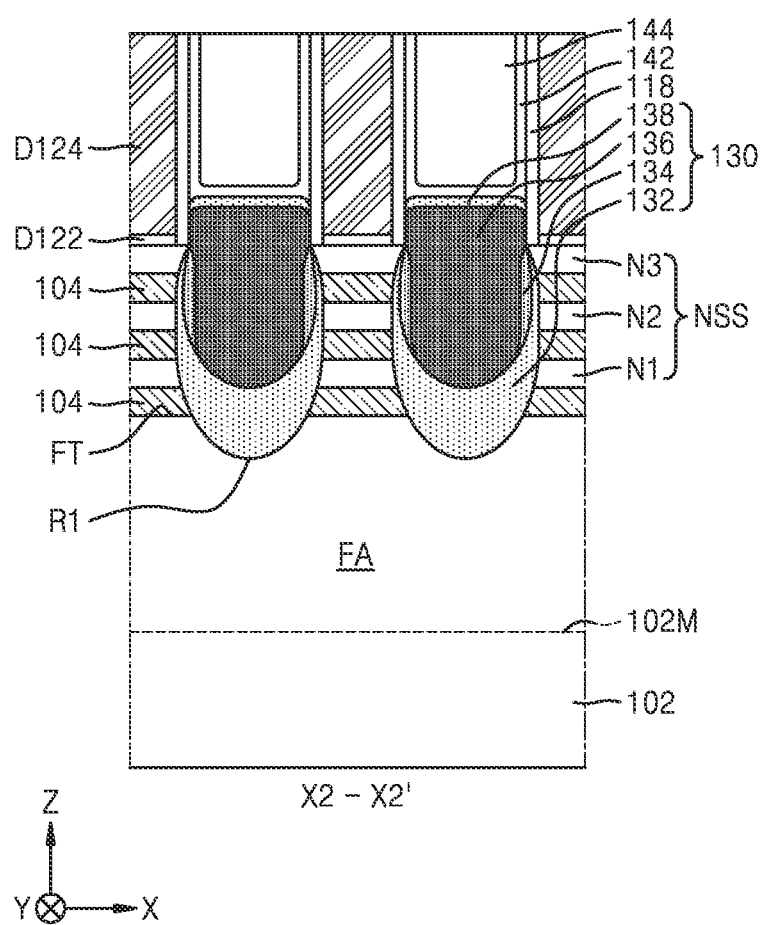

Referring to FIGS. 15A and 15B, the capping layer D126 may be removed from the resultant structure of FIGS. 14A and 14B to expose a top surface of the dummy gate layer D124. The insulating liner 142 and the inter-gate dielectric film 144 may be partially removed such that a top surface of the inter-gate dielectric film 144 is at substantially the same level as the top surface of the dummy gate layer D124.

Figure 16A:
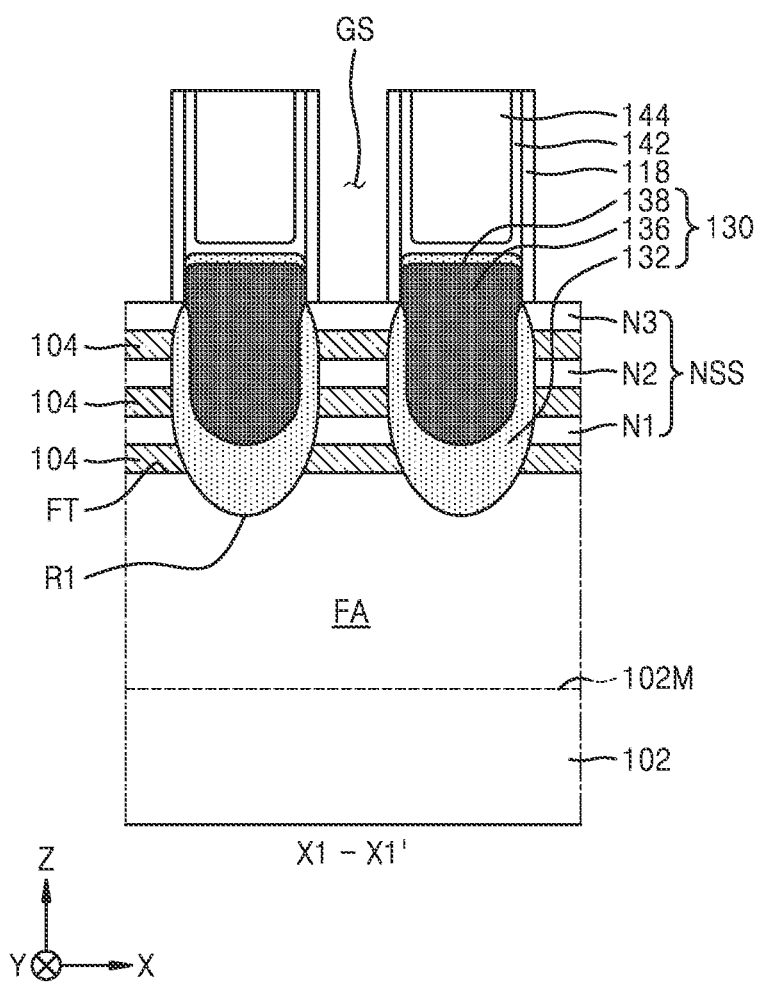
Figure 16B:
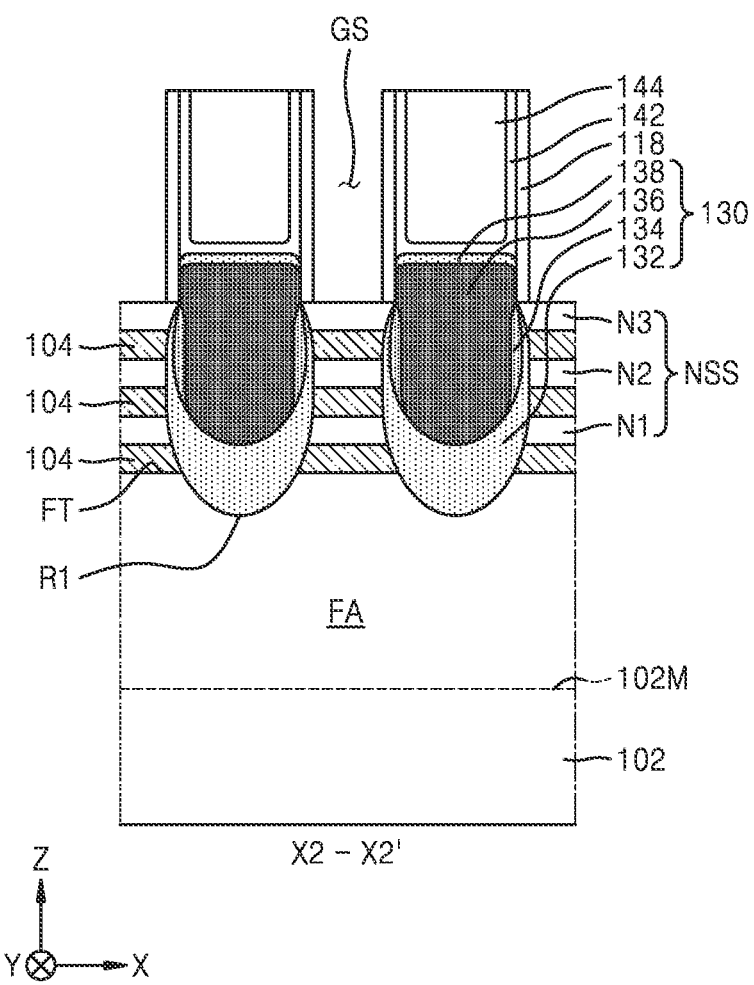

Referring to FIGS. 16A and 16B, the dummy gate layer D124 and the oxide film D122 located thereunder may be removed from the resultant structure of FIGS. 15A and 15B to prepare a gate space GS, and the plurality of nanosheet stacks NSS may be exposed through the gate space GS.

Figure 17A:
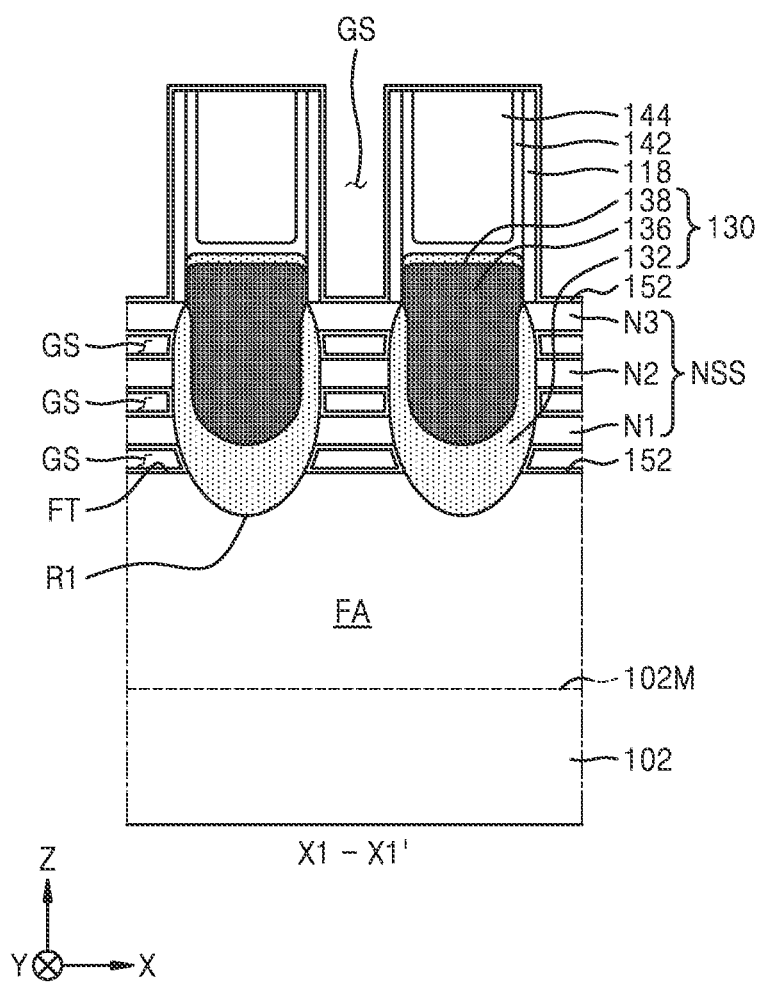
Figure 17B:
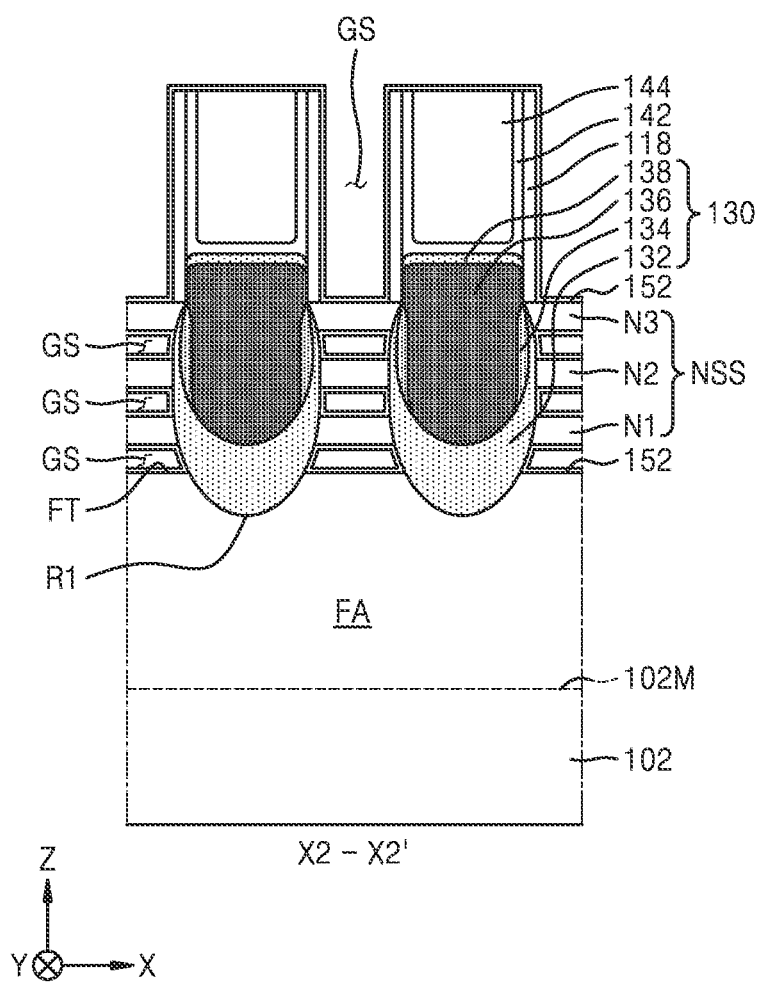

Referring to FIGS. 17A and 17B, in the resultant structure of FIGS. 16A and 16B, the plurality of sacrificial semiconductor layers 104 remaining on the fin-type active region FA may be removed through the gate space GS. Thus, the gate space GS may extend to respective spaces between the first nanosheet N1, the second nanosheet N2, and the third nanosheet N3 and a space between the first nanosheet N1 and the fin top surface FT of the fin-type active region FA.

In exemplary embodiments, to selectively remove the plurality of sacrificial semiconductor layers 104, etch selectivities of the first to third nanosheets N1, N2, and N3 with respect to the plurality of sacrificial semiconductor layers 104 may be used. A liquid or gaseous etchant may be used to selectively remove the plurality of sacrificial semiconductor layers 104. In other exemplary embodiments, to selectively remove the plurality of sacrificial semiconductor layers 104, a $CH_3COOH$-based etchant, for example, an etchant including a mixture of $CH_3COOH$, $HNO_3$, and HF or an etchant including a mixture of $CH_3COOH$, $H_2O_2$, and HF may be used, without being limited thereto.

Each of the plurality of source/drain regions 130 may include the local buffer pattern 134 including the wedge portion 134W that covers the edge buffer portion 132E of the buffer layer 132, and the local buffer pattern 134 may selectively supplement the edge buffer portion 132, which is a relatively vulnerable portion, of the buffer layer 132 of the source/drain region 130. Thus, during the selective removal of the plurality of sacrificial semiconductor layers 104 as described with reference to FIGS. 17A and 17B, an etchant used to selectively remove the plurality of sacrificial semiconductor layers 104 may be prevented from penetrating the main body layer 136, and the main body layer 136 may be protected by the buffer layer 132 and the local buffer pattern 134. Accordingly, the plurality of source/drain regions 130 may be prevented from deteriorating due to external attacks.

Thereafter, a gate dielectric film 152 may be formed to cover respective exposed surfaces of the first to third nanosheets N1, N2, and N3 and the fin-type active region FA. The gate dielectric film 152 may be formed using an atomic layer deposition (ALD) process.

Figure 18A:
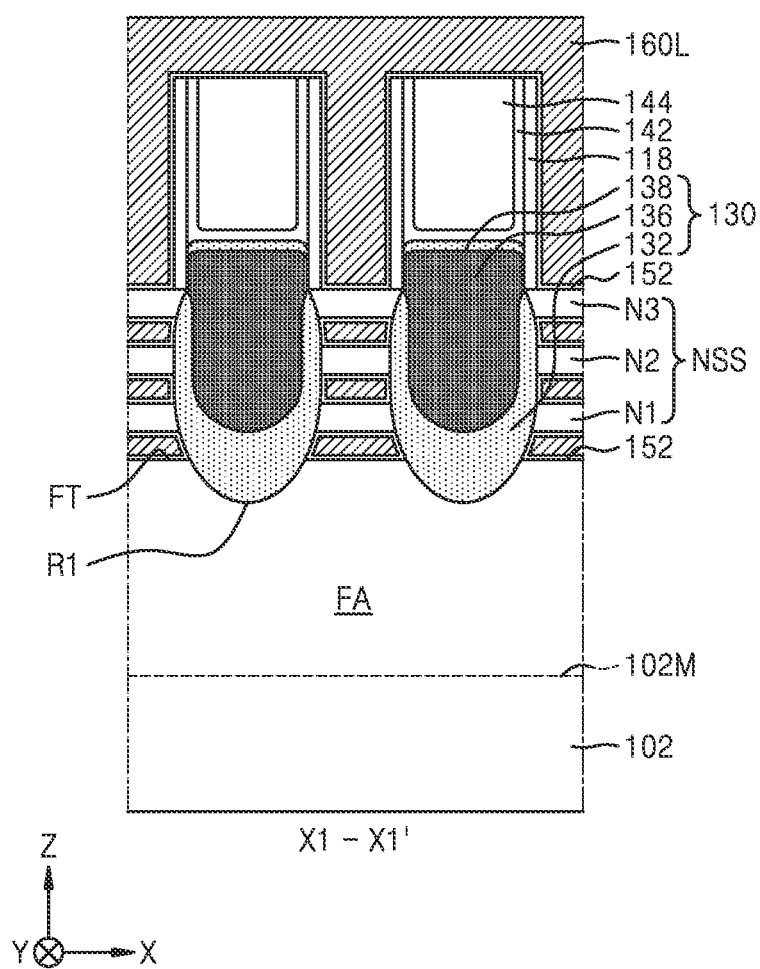
Figure 18B:
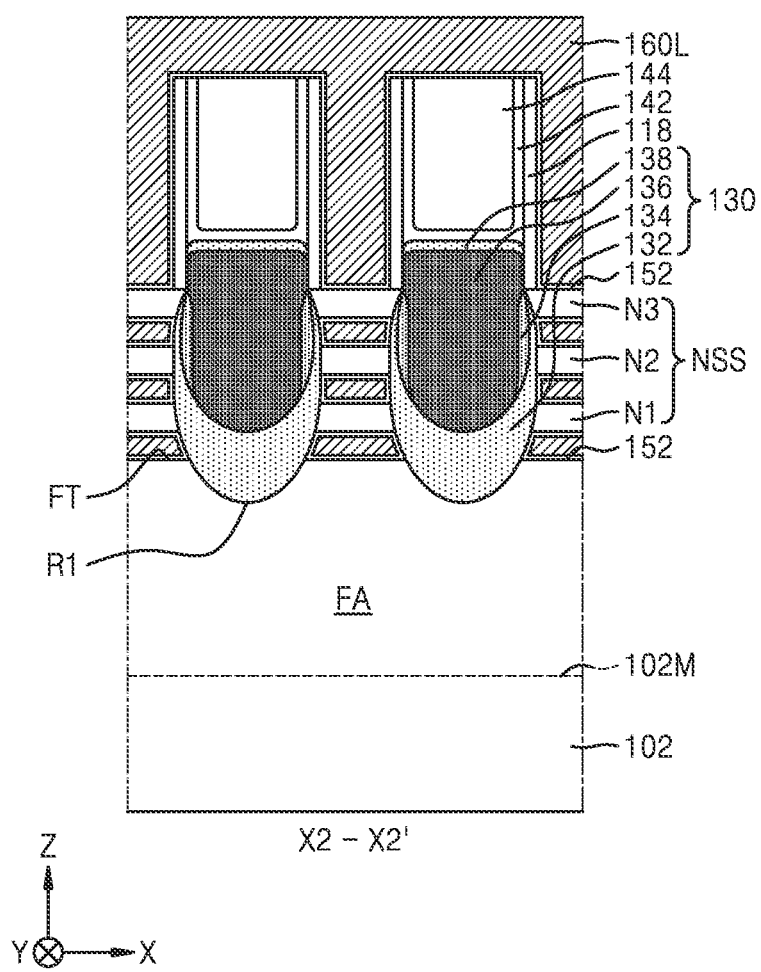

Referring to FIGS. 18A and 18B, on the resultant structure of FIGS. 17A and 17B, a gate-forming conductive layer 160L filling the gate space GS and covering the top surface of the inter-gate dielectric film 144 may be formed on the gate dielectric film 152. The gate-forming conductive layer 160L may include a metal, a metal nitride, metal carbide, or a combination thereof. The gate-forming conductive layer 160L may be formed using an ALD process or a CVD process.

Figure 19A:
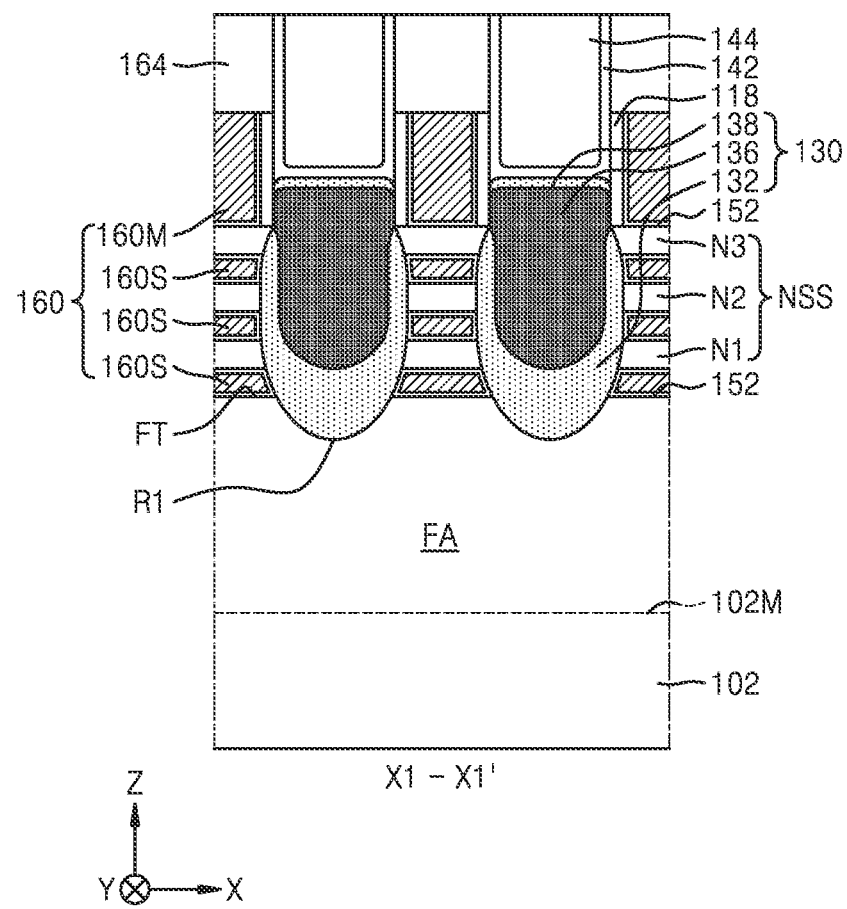
Figure 19B:
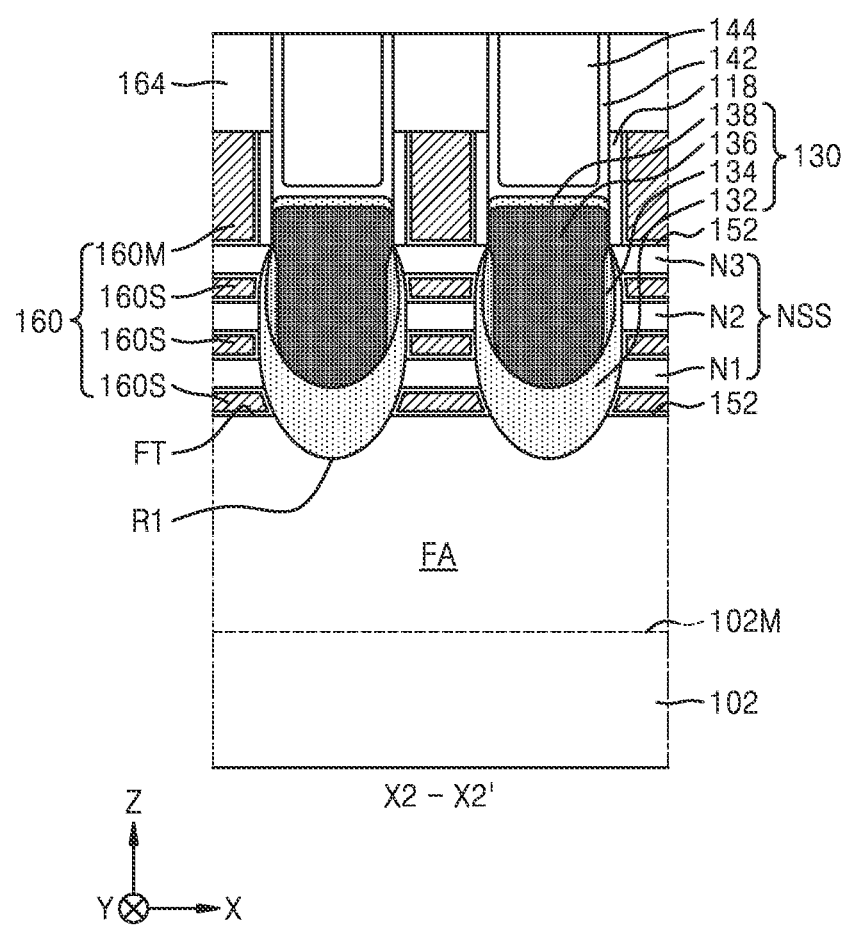

Referring to FIGS. 19A and 19B, in the resultant structure of FIGS. 18A and 18B, the gate-forming conductive layer 160L may be partially removed from a top surface thereof to expose the top surface of the inter-gate dielectric film 144 and empty an upper portion of the gate space GS again. As a result, a plurality of gate lines 160 may be formed from the gate-forming conductive layer 160L. In this case, an upper portion of each of the gate dielectric film 152 and the outer insulating spacer 118 may also be consumed, and thus, a height of each of the gate dielectric film 152 and the outer insulating spacer 118 may be reduced. Thereafter, a capping insulating pattern 164 filling the gate space GS may be formed on the gate line 160.

Although the method of manufacturing the IC device 100 shown in FIGS. 1 and 2A to 2F, according to exemplary embodiment, have been described with reference to FIGS. 7 to 19B, it will be understood that the IC devices 100, 100A, 100B, 200, and 300 shown in FIGS. 3 to 6 and IC devices having various structures may be manufactured by making various modifications and changes within the scope of the inventive concept.

While the inventive concept has been particularly shown and described with reference to exemplary embodiments thereof, it will be understood that various changes in form and details may be made therein without departing from the spirit and scope of the following appended claims.

What is claimed is:

1. An integrated circuit device comprising:
   a fin-type active region extending along a first lateral direction on a substrate;
   a channel region on the fin-type active region;
   a gate line surrounding the channel region on the fin-type active region, the gate line extending along a second lateral direction, the second lateral direction intersecting with the first lateral direction;
   an outer insulating spacer covering a sidewall of the gate line;
   a source/drain region adjacent to the gate line on the fin-type active region, the source/drain region being in contact with the channel region and the outer insulating spacer,
   wherein the source/drain region comprises:
   a buffer layer comprising a portion in contact with the channel region and a portion in contact with the fin-type active region, the buffer layer comprising an edge buffer portion having a smaller thickness than other portions thereof at a position adjacent to the outer insulating spacer;
   a local buffer pattern comprising a wedge portion, the wedge portion filling a space defined by the edge buffer portion of the buffer layer and the outer insulating spacer; and
   a main body layer in contact with each of the buffer layer and the local buffer pattern.

2. The integrated circuit device of claim 1, wherein, in the source/drain region, the buffer layer further comprises a bottom buffer portion in contact with the fin-type active region and a side buffer portion in contact with the channel region, and
   a thickness of the side buffer portion of the buffer layer in the first lateral direction is reduced in a direction toward the outer insulating spacer.

3. The integrated circuit device of claim 1, wherein, in the source/drain region, each of the buffer layer, the local buffer pattern, and the main body layer comprises a $Si_{1-x}Ge_x$ layer (here, x≠0) doped with a p-type dopant, and the buffer layer, the local buffer pattern, and the main body layer have different Ge contents from each other.

4. The integrated circuit device of claim 1, wherein, in the source/drain region, each of the buffer layer, the local buffer pattern, and the main body layer comprises a $Si_{1-x}Ge_x$ layer (here, x≠0) doped with a p-type dopant, each of the buffer layer and the local buffer pattern has a lower Ge content than the main body layer, and the local buffer pattern has a higher Ge content than the buffer layer.

5. The integrated circuit device of claim 1, wherein, in the source/drain region, each of the buffer layer, the local buffer pattern, and the main body layer comprises a $Si_{1-x}Ge_x$ layer (here, x≠0) doped with a p-type dopant, each of the buffer layer and the local buffer pattern has a lower Ge content than the main body layer, and the local buffer pattern has a lower Ge content than the buffer layer.

6. The integrated circuit device of claim 1, wherein, in the source/drain region, each of the buffer layer, the local buffer pattern, and the main body layer comprises a $Si_{1-x}Ge_x$ layer (here, x≠0) doped with a p-type dopant, and
   a concentration of the p-type dopant in an interfacial portion between the local buffer pattern and the main body layer is higher than the concentration of the p-type dopant in other portions of the source/drain region.

7. The integrated circuit device of claim 1, wherein, in the source/drain region, the local buffer pattern further comprises a line portion between the buffer layer and the main body layer, the line portion being integrally connected to the wedge portion.

8. The integrated circuit device of claim 1, wherein, in a cross-section parallel to a main surface of the substrate, an interface between the local buffer pattern and the main body layer in the source/drain region is on an extension line of an interface between the buffer layer and the main body layer, and the interface between the local buffer pattern and the main body layer and the interface between the buffer layer and the main body layer form one planar surface that extends in a plane without bends.

9. The integrated circuit device of claim 1, wherein the channel region comprises a plurality of nanosheets facing a fin top surface of the fin-type active region at a position apart from the fin top surface of the fin-type active region, the plurality of nanosheets being at different vertical distances from the fin top surface of the fin-type active region, and
   the source/drain region is in contact with each of the plurality of nanosheets.

10. The integrated circuit device of claim 1, wherein the channel region comprises a plurality of nanosheets facing a fin top surface of the fin-type active region at a position apart from the fin top surface of the fin-type active region, the plurality of nanosheets being different vertical distances from the fin top surface of the fin-type active region, and,
   in a cross-section parallel to a main surface of the substrate, a width of the local buffer pattern in the second lateral direction gradually increases in a direction away from a nanosheet, which is farthest from the substrate from among the plurality of nanosheets, in the first lateral direction.

11. The integrated circuit device of claim 1, wherein the channel region comprises a plurality of nanosheets facing a fin top surface of the fin-type active region at a position apart from the fin top surface of the fin-type active region, the plurality of nanosheets being at different vertical distances from the fin top surface of the fin-type active region, and, in the source/drain region, the local buffer pattern vertically overlaps the fin-type active region at a position adjacent to an edge portion of each of the plurality of nanosheets in the second lateral direction.

12. An integrated circuit device comprising:

a fin-type active region extending along a first lateral direction on a substrate;

a pair of nanosheet stacks facing a fin top surface of the fin-type active region in a vertical direction at a position apart from the fin top surface of the fin-type active region, each nanosheet stack comprising a plurality of nanosheets being at different vertical distances from the fin top surface of the fin-type active region;

a pair of gate lines on the pair of nanosheet stacks on the fin-type active region, the pair of gate lines extending along a second lateral direction, wherein the second lateral direction intersects with the first lateral direction;

a plurality of outer insulating spacers respectively covering sidewalls of the pair of gate lines; and a source/drain region on the fin-type active region between the pair of nanosheet stacks, the source/drain region comprising a $Si_{1-x}Ge_x$ layer (here, $x \neq 0$) doped with boron (B), wherein the source/drain region comprises a buffer layer in contact with a plurality of nanosheets in each of the pair of nanosheet stacks, the buffer layer comprising an edge buffer portion having a smaller thickness than other portions thereof at a position adjacent to the plurality of outer insulating spacers, the edge buffer portion defining at least one wedge-type space along with an outer insulating spacer adjacent thereto from among the plurality of outer insulating spacers, at least one local buffer pattern filling the at least one wedge-type space, and a main body layer in contact with each of the buffer layer and the at least one local buffer pattern.

13. The integrated circuit device of claim 12, wherein the source/drain region comprises four local buffer patterns separate from each other.

14. The integrated circuit device of claim 12, wherein a concentration of boron in an interfacial portion between the at least one local buffer pattern and the main body layer is higher than the concentration of boron in other portions of the source/drain region.

* * * * *